United States Patent
Enquist et al.

(10) Patent No.: US 10,269,708 B2
(45) Date of Patent: Apr. 23, 2019

(54) INCREASED CONTACT ALIGNMENT TOLERANCE FOR DIRECT BONDING

(71) Applicant: INVENSAS BONDING TECHNOLOGIES, INC., San Jose, CA (US)

(72) Inventors: Paul M. Enquist, Cary, NC (US); Gaius Gillman Fountain, Jr., Youngsville, NC (US); Javier A. DeLaCruz, San Jose, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 15/853,085

(22) Filed: Dec. 22, 2017

(65) Prior Publication Data

US 2018/0204798 A1    Jul. 19, 2018

Related U.S. Application Data

(63) Continuation of application No. 15/379,942, filed on Dec. 15, 2016, now Pat. No. 9,852,988.
(Continued)

(51) Int. Cl.
*H01L 25/065* (2006.01)
*H01L 21/768* (2006.01)
(Continued)

(52) U.S. Cl.
CPC .... *H01L 23/5283* (2013.01); *H01L 21/76838* (2013.01); *H01L 23/5226* (2013.01);
(Continued)

(58) Field of Classification Search
CPC .......... H01L 23/49827; H01L 23/5389; H01L 23/5226; H01L 21/76838;
(Continued)

(56) References Cited

U.S. PATENT DOCUMENTS

| 4,998,665 A | 3/1991 | Hayashi |
| 5,087,585 A | 2/1992 | Hayashi |

(Continued)

FOREIGN PATENT DOCUMENTS

| JP | 2000-100679 | 4/2000 |
| JP | 2001-102479 | 4/2001 |

(Continued)

OTHER PUBLICATIONS

U.S. Appl. No. 15/387,385, filed Dec. 21, 2016, Wang et al.
(Continued)

*Primary Examiner* — Jasmine J Clark
(74) *Attorney, Agent, or Firm* — Knobbe, Martens, Olson & Bear, LLP

(57) ABSTRACT

A bonded device structure including a first substrate having a first set of conductive contact structures, preferably connected to a device or circuit, and having a first non-metallic region adjacent to the contact structures on the first substrate, a second substrate having a second set of conductive contact structures, preferably connected to a device or circuit, and having a second non-metallic region adjacent to the contact structures on the second substrate, and a contact-bonded interface between the first and second set of contact structures formed by contact bonding of the first non-metallic region to the second non-metallic region. The contact structures include elongated contact features, such as individual lines or lines connected in a grid, that are non-parallel on the two substrates, making contact at intersections. Alignment tolerances are thus improved while minimizing dishing and parasitic capacitance.

20 Claims, 17 Drawing Sheets

Related U.S. Application Data

(60) Provisional application No. 62/269,412, filed on Dec. 18, 2015.

(51) Int. Cl.
*H01L 23/528* (2006.01)
*H01L 23/522* (2006.01)
*H01L 25/00* (2006.01)
*H01L 23/00* (2006.01)

(52) U.S. Cl.
CPC .......... *H01L 24/02* (2013.01); *H01L 25/0657* (2013.01); *H01L 25/50* (2013.01); *H01L 2224/16145* (2013.01); *H01L 2224/80* (2013.01); *H01L 2225/06513* (2013.01); *H01L 2225/06555* (2013.01); *H01L 2225/06593* (2013.01)

(58) Field of Classification Search
CPC . H01L 2225/06593; H01L 2224/16145; H01L 25/0657; H01L 23/5283; H01L 24/02; H01L 25/50
USPC ......................................................... 438/406
See application file for complete search history.

(56) References Cited

U.S. PATENT DOCUMENTS

| | | | |
|---|---|---|---|
| 5,322,593 A | 6/1994 | Hasegawa et al. | |
| 5,408,053 A | 4/1995 | Young | |
| 5,471,090 A | 11/1995 | Deutsch et al. | |
| 5,985,739 A | 11/1999 | Plettner et al. | |
| 5,998,808 A | 12/1999 | Matsushita | |
| 6,008,126 A | 12/1999 | Leedy | |
| 6,080,640 A | 6/2000 | Gardner et al. | |
| 6,265,775 B1 | 7/2001 | Seyyedy | |
| 6,300,161 B1 | 10/2001 | Goetz et al. | |
| 6,374,770 B1 | 4/2002 | Lee | |
| 6,418,029 B1 | 7/2002 | McKee et al. | |
| 6,638,808 B1 | 10/2003 | Ochi | |
| 6,713,871 B2 | 3/2004 | Searls et al. | |
| 6,887,769 B2 | 5/2005 | Kellar et al. | |
| 7,078,811 B2 | 7/2006 | Suga | |
| 7,126,212 B2 | 10/2006 | Enquist et al. | |
| 7,339,798 B2 | 3/2008 | Chakravorty | |
| 7,354,798 B2 | 4/2008 | Pogge et al. | |
| 7,355,836 B2 | 4/2008 | Radhakrishnan et al. | |
| 7,705,691 B2 | 4/2010 | Lu et al. | |
| 7,741,724 B2 | 6/2010 | Morikawa et al. | |
| 7,746,663 B2 | 6/2010 | Hashimoto | |
| 8,183,127 B2 | 5/2012 | Patti et al. | |
| 8,241,961 B2 | 8/2012 | Kim et al. | |
| 8,314,007 B2 | 11/2012 | Vaufredaz | |
| 8,357,931 B2 | 1/2013 | Schieck et al. | |
| 8,476,146 B2 | 7/2013 | Chen et al. | |
| 8,698,323 B2 | 4/2014 | Mohammed et al. | |
| 8,841,002 B2 | 9/2014 | Tong | |
| 8,916,448 B2 | 12/2014 | Cheng et al. | |
| 9,171,756 B2 | 10/2015 | Enquist et al. | |
| 9,184,125 B2 | 11/2015 | Enquist et al. | |
| 9,263,186 B2 | 2/2016 | Li et al. | |
| 9,331,149 B2 | 5/2016 | Tong et al. | |
| 9,385,024 B2 | 7/2016 | Tong et al. | |
| 9,391,143 B2 | 7/2016 | Tong et al. | |
| 9,431,368 B2 | 8/2016 | Enquist et al. | |
| 9,496,202 B2 | 11/2016 | Hashimoto | |
| 9,496,239 B1 | 11/2016 | Edelstein et al. | |
| 9,537,199 B2 | 1/2017 | Dang et al. | |
| 10,002,844 B1 | 6/2018 | Wang et al. | |
| 2002/0000328 A1 | 1/2002 | Motomura et al. | |
| 2002/0003307 A1 | 1/2002 | Suga | |
| 2005/0135041 A1 | 6/2005 | Kang et al. | |
| 2005/0231303 A1 | 10/2005 | Chang et al. | |
| 2006/0012966 A1 | 1/2006 | Chakravorty | |
| 2006/0017144 A1 | 1/2006 | Uematsu et al. | |
| 2006/0145778 A1 | 7/2006 | Pleva et al. | |
| 2007/0147014 A1 | 6/2007 | Chang et al. | |
| 2008/0124835 A1 | 5/2008 | Chen et al. | |
| 2009/0206962 A1 | 8/2009 | Chou et al. | |
| 2011/0115579 A1 | 5/2011 | Rofougaran | |
| 2012/0013499 A1 | 1/2012 | Hayata | |
| 2012/0168217 A1 | 7/2012 | Hsu et al. | |
| 2013/0063863 A1 | 3/2013 | Timler et al. | |
| 2013/0105943 A1 | 5/2013 | Lai et al. | |
| 2013/0207234 A1 | 8/2013 | Ikeda et al. | |
| 2013/0265733 A1 | 10/2013 | Herbsommer et al. | |
| 2013/0286544 A1 | 10/2013 | Azais | |
| 2014/0001568 A1 | 1/2014 | Wang et al. | |
| 2014/0048908 A1 | 2/2014 | Chen et al. | |
| 2014/0145338 A1 | 5/2014 | Fujii et al. | |
| 2014/0175629 A1 | 6/2014 | Sun et al. | |
| 2014/0184351 A1 | 7/2014 | Bae et al. | |
| 2014/0252635 A1 | 9/2014 | Tran et al. | |
| 2014/0264751 A1 | 9/2014 | Chen et al. | |
| 2014/0264948 A1* | 9/2014 | Chou .................... H01L 23/498 257/777 |
| 2014/0370658 A1 | 12/2014 | Tong et al. | |
| 2014/0377946 A1 | 12/2014 | Cha et al. | |
| 2015/0097298 A1 | 4/2015 | Chen et al. | |
| 2015/0194379 A1 | 7/2015 | Chen et al. | |
| 2015/0206902 A1 | 7/2015 | Cheng et al. | |
| 2015/0235952 A1 | 8/2015 | Pan et al. | |
| 2016/0111404 A1 | 4/2016 | Sanders et al. | |
| 2016/0155677 A1 | 6/2016 | Bonart et al. | |
| 2016/0197630 A1 | 7/2016 | Kawasaki | |
| 2016/0233195 A1 | 8/2016 | Nagai | |
| 2016/0254345 A1 | 9/2016 | Singh et al. | |
| 2016/0309578 A1 | 10/2016 | Park | |
| 2016/0372449 A1 | 12/2016 | Rusu et al. | |
| 2017/0062366 A1 | 3/2017 | Enquist | |
| 2017/0062409 A1 | 3/2017 | Basker et al. | |
| 2017/0179029 A1 | 6/2017 | Enquist et al. | |
| 2017/0200711 A1 | 7/2017 | Uzoh et al. | |
| 2017/0338214 A1 | 11/2017 | Uzoh et al. | |
| 2017/0343498 A1 | 11/2017 | Kalnitsky et al. | |
| 2018/0096931 A1 | 4/2018 | Huang et al. | |

FOREIGN PATENT DOCUMENTS

| | | |
|---|---|---|
| JP | 2002-353416 | 12/2002 |
| JP | 2008-258258 | 10/2008 |
| KR | 10-2006-0105797 | 10/2006 |
| WO | WO 2005/064646 A2 | 7/2005 |
| WO | WO 2012/125237 A2 | 9/2012 |

OTHER PUBLICATIONS

U.S. Appl. No. 15/395,197, filed Dec. 30, 2016, Huang et al.
U.S. Appl. No. 15/426,942, filed Feb. 7, 2017, DeLaCruz et al.
U.S. Appl. No. 15/849,383, filed Dec. 20, 2017, Enquist et al.
U.S. Appl. No. 15/856,391, filed Dec. 28, 2017, Haba et al.
U.S. Appl. No. 15/940,273, filed Mar. 29, 2018, Huang et al.
Amirfeiz et al., "Formation of silicon structures by plasma-activated wafer bonding," Journal of The Electrochemical Society, 2000, vol. 147, No. 7, pp. 2693-2698.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.

(56) References Cited

OTHER PUBLICATIONS

Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs-Si and InP-Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion dated May 29, 2017, issued in International Application No. PCT/US2016/067182, 14 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Onodera et al., "The effect of prebonding heat treatment on the separability of Au wire from Ag—plated Cu alloy substrate," Electronics Packaging Manufacturing, IEEE Transactions, Jan. 2002, vol. 25, Issue 1, pp. 5-12.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.

Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar—beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.

(56) References Cited

OTHER PUBLICATIONS

Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Jeon, Y. et al., "Design of an on-interposer passive equalizer for high bandwidth memory (HBM) with 30Gbps data transmission," Electronic Components and Technology Conference (ECTC), 2016 IEEE 66th, Aug. 18, 2016.
Kim, H. et al., "A wideband on-interposer passive equalizer design for chip-to-chip 30-Gb/s serial data transmission," IEEE Transactions on Components, Packaging and Manufacturing Technology, Jan. 2015, vol. 5, Issue 1, pp. 28-39.
Lee, H. et al., "Signal integrity of bump-less high-speed through silicon via channel for terabyte/s bandwidth 2.5D IC," 2016 IEEE 66th Electronic Components and Technology Conference, Aug. 18, 2016.
Westphal, W.B. et al., "Dielectric constant and loss data," Air Force Materials Laboratory, Apr. 1972.
International Search Report and Written Opinion dated Apr. 23, 2018, issued in International Application No. PCT/US2017/068788, 13 pages.
International Search Report and Written Opinion dated Jan. 9, 2018, issued in International Application No. PCT/US2017/052409, 19 pages.
International Search Report and Written Opinion dated Jul. 17, 2018, issued in International Application No. PCT/US2018/025241, 15 pages.

\* cited by examiner

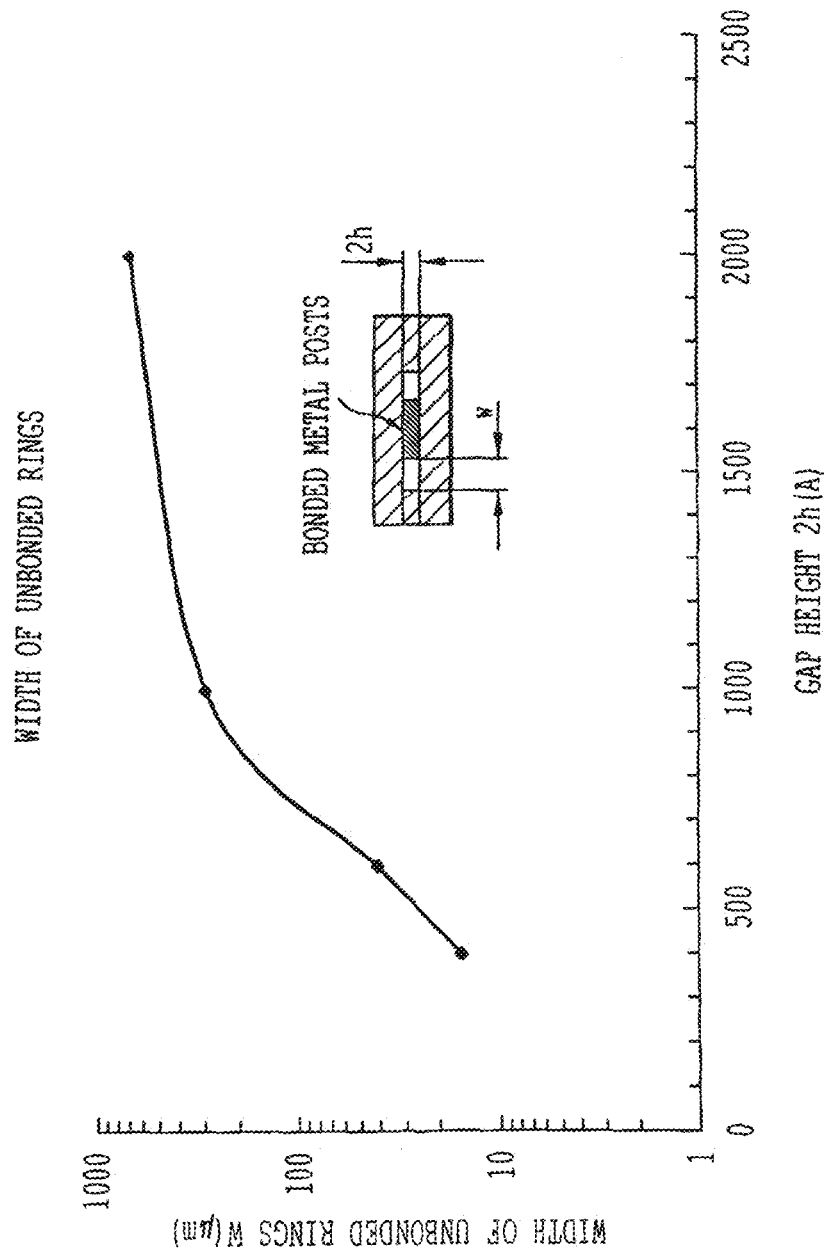

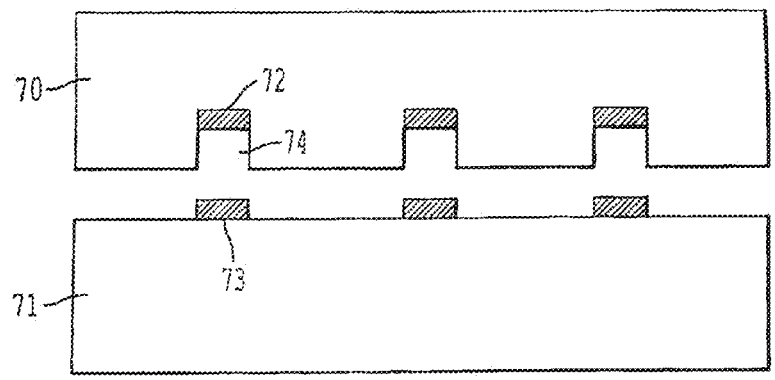
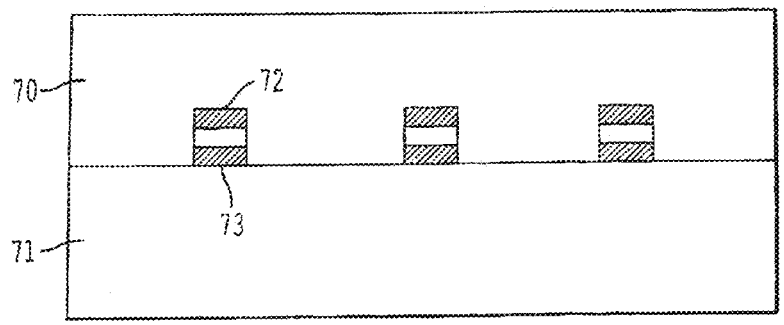
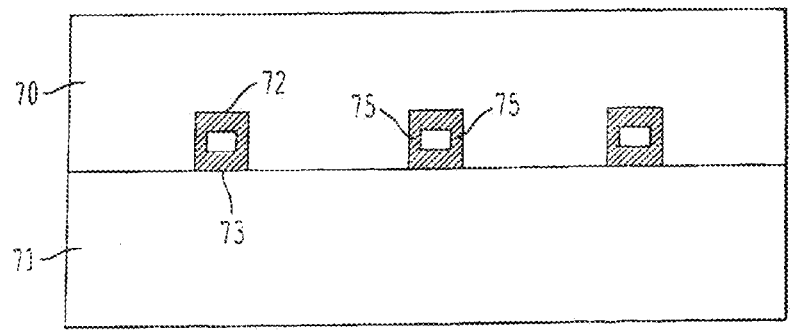

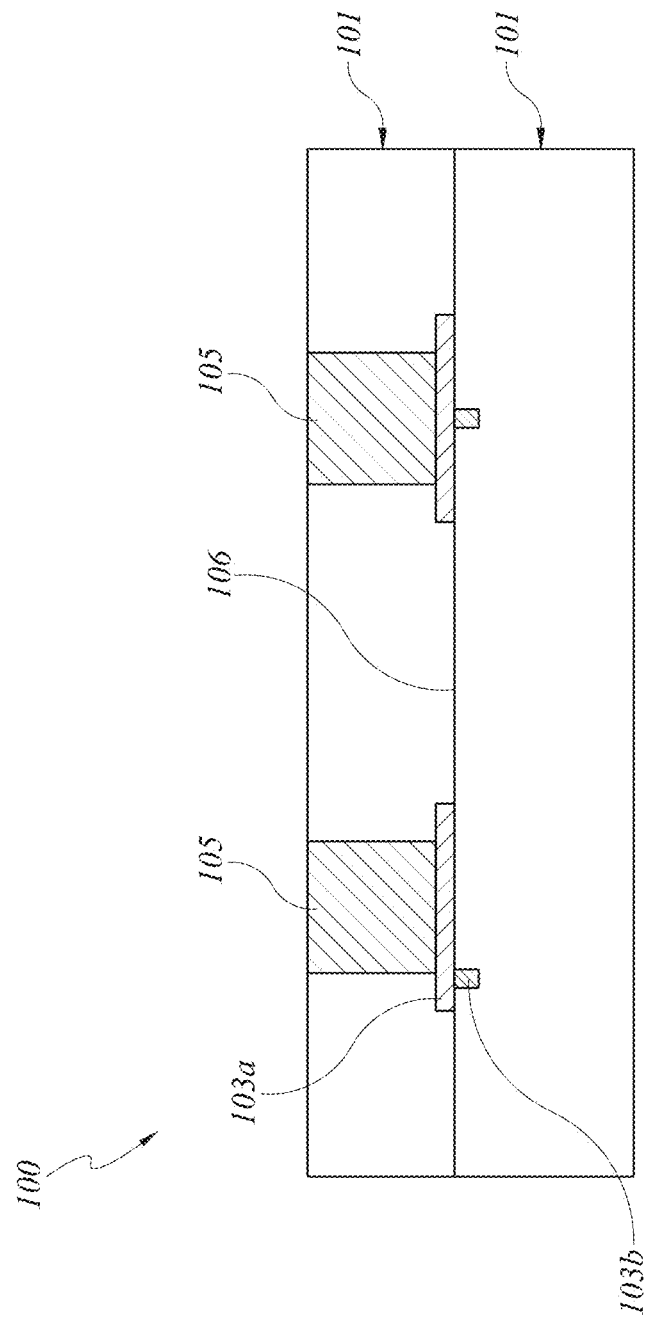

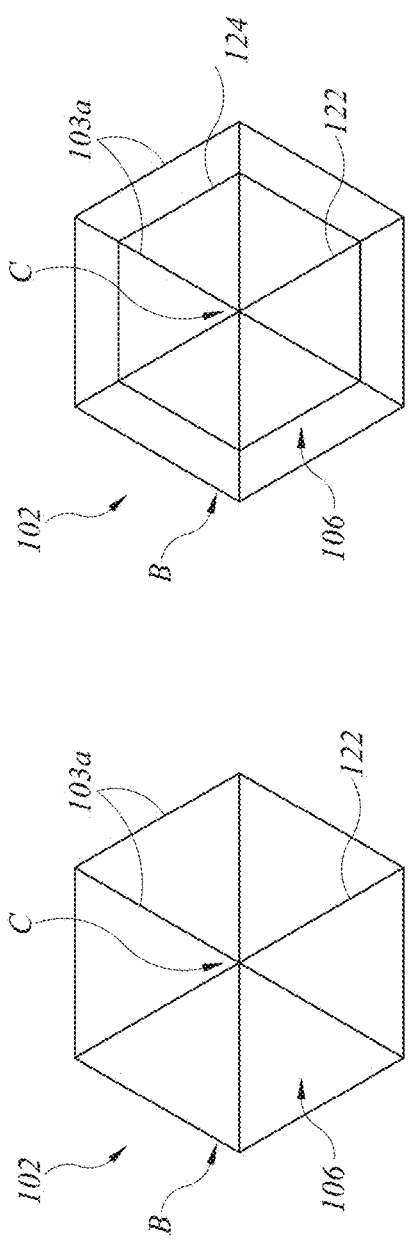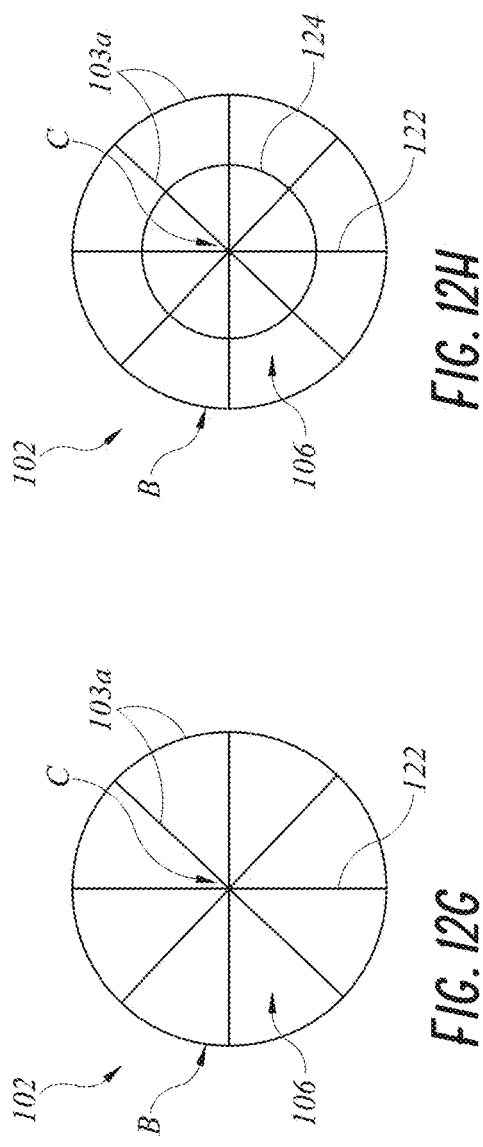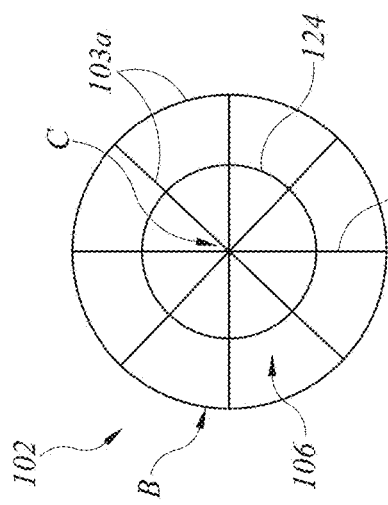

INCREASED CONTACT ALIGNMENT TOLERANCE FOR DIRECT BONDING

CROSS-REFERENCE TO RELATED APPLICATIONS

This application claims the benefit of U.S. Provisional Patent Application No. 62/269,412, filed Dec. 18, 2015, the entire contents of which are incorporated by reference herein for all purposes.

BACKGROUND

Field

The field relates to direct wafer bonding, and more particularly to the bonding and electrical interconnection of substrates to be utilized in semiconductor device and integrated circuit fabrication.

DESCRIPTION OF THE RELATED ART

As the physical limits of conventional CMOS device are being approached and the demands for high performance electronic systems are imminent, system-on-a chip (SOC) is becoming a natural solution of the semiconductor industry. For system-on-a chip preparation, a variety of functions are required on a chip. While silicon technology is the mainstay technology for processing a large number devices, many of the desired circuit and optoelectronic functions can now best be obtained from individual devices and/or circuits fabricated in materials other than silicon. Hence, hybrid systems which integrate non-silicon based devices with silicon based devices offer the potential to provide unique SOC functions not available from pure silicon or pure non-silicon devices alone.

One method for heterogeneous device integration has been the hetero-epitaxial growth of dissimilar materials on silicon. To date, such hetero-epitaxial growth has realized a high density of defects in the hetero-epitaxial grown films, largely due to the mismatches in lattice constants between the non-silicon films and the substrate.

Another approach to heterogeneous device integration has been wafer bonding technology. However, wafer bonding of dissimilar materials having different thermal expansion coefficients at elevated temperature introduces thermal stresses that lead to dislocation generation, debonding, or cracking. Thus, low temperature bonding is desired. Low temperature bonding is also crucial for the bonding of dissimilar materials if the dissimilar materials include materials with low decomposition temperatures or temperature sensitive devices such as, for example, an InP heterojunction bipolar transistor or a processed Si device with ultrashallow source and drain profiles.

The design of processes needed to produce different functions on the same chip containing different materials is difficult and hard to optimize. Indeed, many of the resultant SOC chips (especially those at larger integration size) show a low yield. One approach has been to interconnect fully processed ICs by wafer adhesive bonding and layer transfer. See, for example, Y. Hayashi, S. Wada, K. Kajiyana, K. Oyama, R. Koh, S Takahashi and T. Kunio, *Symp. VLSI Tech. Dig.* 95 (1990) and U.S. Pat. No. 5,563,084, the entire contents of both references are incorporated herein by reference. However, wafer adhesive bonding usually operates at elevated temperatures and suffers from thermal stress, out-gassing, bubble formation and instability of the adhesive, leading to reduced yield in the process and poor reliability over time. Moreover, the adhesive bond is usually not hermetic.

Wafer direct bonding is a technology that allows wafers to be bonded at room temperature without using any adhesive. The room temperature direct wafer bond is typically hermetic. It is not prone to introduce stress and inhomogeneity as in the adhesive bonding. Further, if the low temperature bonded wafer pairs can withstand a thinning process, when one wafer of a bonded pair is thinned to a thickness less than the respective critical value for the specific materials combination, the generation of misfit dislocations in the layer and sliding or cracking of the bonded pairs during subsequent thermal processing steps can be avoided. See, for example, Q.-Y. Tong and U. Gösele, *Semiconductor Wafer Bonding: Science and Technology*, John Wiley & Sons, New York, (1999), the entire contents of which are incorporated herein by reference.

Moreover, wafer direct bonding and layer transfer is a VLSI (Very Large Scale Integration) compatible, highly flexible and manufacturable technology, and thus suitable for forming three-dimensional system-on-a chip (3-D SOC). The 3-D SOC approach can be seen as the integration of existing integrated circuits to form a system on a chip.

Moreover, as the integration complexity grows, so do the demands on the integration process to robustly unify diverse circuits at low temperature, preferably at room temperature, resulting in lower or no additional stress and more reliable circuits.

Low or room temperature direct wafer bonding of metal between wafers or dies being bonded is desirable for 3D-SOC preparation. Such direct metal bonding can be used in conjunction with direct wafer bonding of non-metal between wafers or dies to result in electrical interconnection between wafers or dies being bonded when they are mechanically bonded. Simultaneous metal and non-metal bonding can eliminate the need to for post-bond processing, like substrate thinning, via etching, and interconnect metallization, to achieve an electrical interconnection between bonded wafers or die. Very small bonding metal pads can be used, resulting in very low parasitic impedance and resulting reduced power and increased bandwidth capability.

Bonding of metals with clean surfaces is well-known phenomenon. For example, thermocompression wire bonding has been applied to wafer-level bonding. Temperature, pressure and low hardness metals are typically employed and usually results in residual stresses. See, for example, M. A. Schmidt, Proc. IEEE, Vol. 86, No. 8, 1575 (1998), Y. Li, R. W. Bower, I. Bencuya, Jpn. J. Appl. Phys. Vol. 37, L1068 (1988). Direct bonding of Pd metal layer covered silicon or III V compound wafers at 250-350° C. has been reported by B. Aspar, E. Jalaguier, A. Mas, C. Locatelli, O. Rayssac, H. Moricean, S. Pocas, A. Papon, J. Michasud and M. Bruel, Electon. Lett., 35, 12 (1999). However, $Pd_2Si$ silicide or Pd-III V alloys, not metal Pd, are actually formed and bonded. Bonding of Au and Al at room temperature has been achieved by using ultrasonic and compressive load at flip chip bonding, see, for example, M. Hizukuri, N. Watanabe and T. Asano, Jpn. J. Appl. Phys. Vol. 40, 3044 (2001). Room temperature metal bonding at wafer level has been realized in ultrahigh vacuum (UHV) systems with a base pressure lower than $3\times10^{-8}$ mbar. Usually an ion argon sputtering or fast atom-beam is used to clean the bonding surfaces followed by application of an external pressure to the bonding substrates. See, for example, T. Suga, Proc. The $2^{nd}$ Intl. Symposium on semiconductor wafer bonding, the Electrochemical Soc. Proc. Vol. 93-29, p. 71 (1993). Room temperature bonding between two Si substrates with thin sputtered Ti, Pt and Au films has also been accomplished using applied force after thin film sputter deposition at 4-40 μbar of Ar pressure in a UHV system with base pressure less than $3\times10^{-8}$ mbar. See, for example, T. Shimatsu, R. H. Mollema, D. Monsma, E. G. Keim and J. C. Lodder, J. Vac. Sci. Technol. A 16(4), 2125 (1998).

Direct bonding of metal features or contacts and non-metal field regions is disclosed in U.S. Pat. Nos. 7,485,968 and 6,962,835, the disclosures of each of which are expressly incorporated by reference herein. It can be challenging, however, to achieve both alignment of metal features from two substrates and achieve reliable metal bonding while also directly bonding surrounding non-metal regions.

SUMMARY

In one embodiment, a bonded structure is disclosed. The bonded structure can include a first semiconductor element comprising a conductive first contact structure and a non-metallic first bonding region proximate the first contact structure, the first contact structure comprising a conductive first elongate contact feature. The bonded structure can also include a second semiconductor element comprising a conductive second contact structure and a non-metallic second bonding region proximate the second contact structure, the second contact structure comprising a conductive second contact feature. The first bonding region can be in contact with and directly bonded to the second bonding region. The first elongate contact feature can be oriented non-parallel with and can directly contact the second contact feature at an intersection between the first elongate contact feature and the second contact feature.

In another embodiment, a bonding method is disclosed. The bonding method can include providing a first semiconductor element comprising a conductive first contact structure and a non-metallic first bonding region proximate the first contact structure, the first contact structure comprising a conductive first elongate contact feature. The method can include providing a second semiconductor element comprising a conductive second contact structure and a non-metallic second bonding region proximate the second contact structure, the second contact structure comprising a conductive second contact feature. The method can include orienting and bringing together the first and second semiconductor elements, such that the first elongate contact feature and the second contact feature are nonparallel. The method can include directly bonding the first bonding region with the second bonding region. The method can include directly bonding the first elongate contact feature and the second contact feature at an intersection between the first elongate contact feature and the second contact feature.

In yet another embodiment, a bonded structure is disclosed. The bonded structure can include a first semiconductor element comprising a conductive first contact structure and a non-metallic first bonding region proximate the first contact structure, the first contact structure comprising a conductive first grid pattern of multiple intersecting lines. The bonded structure can include a second semiconductor element comprising a conductive second contact structure and a non-metallic second bonding region proximate the second contact structure, the second contact structure comprising a conductive second grid pattern of multiple intersecting lines. The first bonding region can be in contact with and directly bonded to the second bonding region. The first grid pattern can intersect and directly contact the second grid pattern.

In another embodiment, a bonded structure is disclosed. The bonded structure can include a first semiconductor element comprising a conductive first contact structure and a non-metallic first bonding region surrounding the first contact structure. The first contact structure can include a conductive first elongate contact feature, the first elongate contact feature comprising a heavily doped semiconductor material. The first bonding region can comprise a lightly doped or an undoped semiconductor material. The bonded structure can include a second semiconductor element comprising a conductive second contact structure and a non-metallic second bonding region surrounding the second contact structure, the second contact structure comprising a conductive second contact feature. The first bonding region can be in contact with and directly bonded to the second bonding region. The first elongate contact feature can directly contact and be directly bonded to the second contact feature.

In yet another embodiment, a semiconductor element is disclosed. The semiconductor element can comprise a substrate comprising one or more layers of non-metallic material. The semiconductor element can comprise a plurality of conductive traces embedded in the substrate, the traces extending laterally through the substrate to route electrical signals laterally. The semiconductor element can comprise an elongate contact feature extending along and directly contacting a first trace of the plurality of traces, the contact feature exposed at a top surface of the substrate.

An object is thus to obtain mechanical and electrical contact between wafers and die with a single bonding step.

Another object is to provide a low or room temperature bonding method by which metallic bonding between wafers or die of semiconductor circuits can be formed in ambient without using external pressure.

An additional object is to provide a low or room temperature bonding method by which metallic bonding of layers of any metal between wafers or die of semiconductor circuits can be formed at room temperature at wafer level in ambient without using external pressure by covering metal layers with a thin film of gold or copper or palladium.

Still another object is to provide a room temperature bonding method at wafer level in ambient without using external pressure by which metallic as well as covalent bonds are formed simultaneously at room temperature on bonding surfaces of wafers or die comprised of semiconductor circuits where metal and other non-metal layers co-exist.

Another object is to provide a room temperature bonding method by which different substrates or different materials on different substrates with different thermal expansion coefficients can be bonded together without generation of catastrophic stresses between the different substrates or different materials on different substrates.

Still another object is a room temperature bonding method by which the bond strength between substrates approaches the mechanical fracture strength of the substrates.

Another object is to provide a bonded device structure including devices fabricated individually on separate substrates and bonded on a common substrate.

A still further object is to provide a method and device whereby a reliable mechanical bond can be formed at or near room temperature and a reliable electrical contact can be subsequently formed with a simple low temperature anneal.

These and other objects are achieved by a bonded method and device structure including a first substrate having a first plurality of metallic bonding pads, preferably connected to a device or circuit, and having a first non-metallic region adjacent to the metallic bonding pads on the first substrate, a second substrate having a second plurality of metallic bonding pads, preferably connected to a second device or circuit, aligned or alignable with the first plurality of metallic bonding pads and having a second non-metallic region adjacent to the metallic bonding pads on the second substrate, and a contact-bonded interface between the first and second set of metallic bonding pads.

BRIEF DESCRIPTION OF THE DRAWINGS

A more complete appreciation of the disclosed embodiments and many attendant advantages thereof will be readily obtained as the same becomes better understood by reference to the following detailed description when considered in connection with the accompanying drawings, wherein:

FIG. 2D is graph showing the width of an unbonded ring area W as a function of the metal pad thickness 2 h separating the semiconductor dies as shown in the insert;

FIG. 7A is a schematic diagram of an embodiment having reflowable metal material exposed to the surface on two devices prior to direct wafer bonding of the non-metal surfaces.

FIG. 7B is a schematic diagram of an embodiment having reflowable metal material sealed by after direct wafer bonding of the non-metal surfaces.

FIG. 7C is a schematic diagram of an embodiment having reflowable metal reflowed after direct wafer bonding of non-metal surfaces sealed the reflowable metal.

FIG. 9B is a schematic side sectional view of the bonded semiconductor structure of FIG. 9a.

FIG. 12E is a schematic top plan view of a conductive contact structure having a hexagonal profile, according to various embodiments.

FIG. 12F is a schematic top plan view of a conductive contact structure having a hexagonal profile, according to another embodiment.

FIG. 12G is a schematic top plan view of a conductive contact structure having a rounded profile, according to various embodiments.

FIG. 12H is a schematic top plan view of a conductive contact structure having a rounded profile, according to another embodiment.

DETAILED DESCRIPTION

Figure 1A:
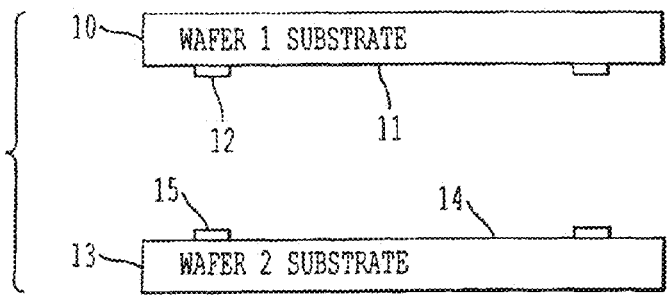
FIG. 1A is a schematic depiction of a pair of unbonded substrates having aligned metal bonding pads.

Referring now to the drawings, wherein like reference numerals designate like or corresponding parts throughout the several views, and more particularly to FIGS. 1A-1D and 2 illustrating a first embodiment of a bonding process. In the first embodiment, direct metal-metal bonding is generated when metal contact regions on separate wafers upon alignment are contact pressure bonded by the intrinsic forces generated when non-metallic regions peripheral to the metallic regions undergo room-temperature chemical bonding. Chemical bonding as used throughout this specification is defined as a bond strength developed when surface bonds on the surface of one wafer react with the surface bonds on the surface of an opposing wafer to form direct bonds across the surface elements, such as a covalent bond. Chemical bonds are manifest by their high bond strengths, approaching for instance the fracture strength of the wafer materials, and thus are differentiated for example from mere Van der Waals bonding. Examples of chemical bond strengths achieved by the methods of the disclosed embodiments are discussed below. In the chemical bonding process, substantial forces are developed. These forces can be sufficiently great to increase the internal pressure of the metallic regions as the chemical bond propagates between the opposed non-metallic regions.

FIG. 1A shows two wafers 10, 13 with respective opposing wafer surfaces 11, 14. The wafer surfaces may be pure elemental semiconductor surfaces, may be pure elemental semiconductor surfaces including a relatively small amount of native oxide, or may be an insulator such as oxide-coated surface. In various embodiments, the wafer surfaces may comprise at least one of glass, silicon-on-insulator, silicon nitride, silicon carbide, sapphire, germanium, gallium arsenide, gallium nitride, polymers, indium phosphide, or any other suitable material. The surfaces may be prepared as described in U.S. Pat. Nos. 6,984,571; 6,902,987; and 6,500,694, the contents of each of which are hereby incorporated by reference in their entirety, to produce a smooth, activated surface. Techniques such as polishing or polishing and very slightly etching (VSE) may be used. A bonding layer may be deposited and polished or polished and then slightly etched. The resulting surfaces are complementary and have chemical bonding surfaces that are planar and smooth, having chemical bonding surface roughness in the range of 5-15 Å, preferably no more than 10 Å, and more preferably no more than 5 Å.

Figure 1B:
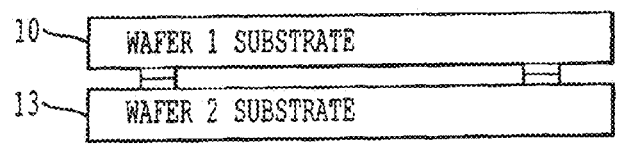
FIG. 1B is a schematic depiction of a pair of unbonded substrates having the aligned metal bonding pads contacted.
Figure 1C:
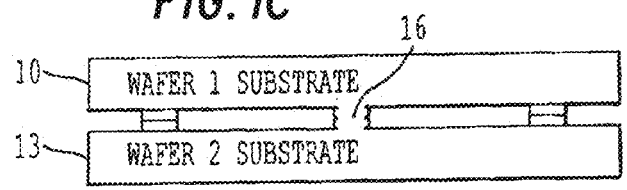
FIG. 1C is a schematic depiction of a pair of contacted substrates bonded in a non-metal region away from the metal bonding pads.
Figure 1D:
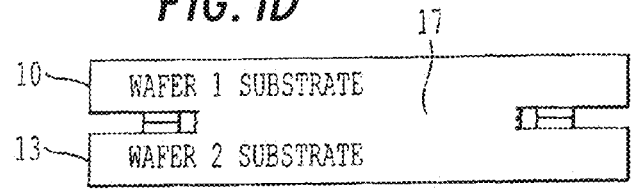
FIG. 1D is a schematic depiction of a pair of contacted substrates bonded across the non-metal regions except for a small unbonded ring area near the metal bonding pads.

Each wafer includes a set of metallic pads 12, 15 and a non-metallic region adjacent to the metallic bonding pads in the surfaces 11, 14. The non-planarity and surface roughness of the metallic bonding pads may be larger than that of the chemical bonding surfaces. Pads 12, 15 may be electrically connected, directly or indirectly, to internal circuits and/or through silicon vias (TSVs), and may be used to route electrical connections to the respective devices and/or circuits pre-fabricated on the wafers. The pads are preferably formed before surface treatment, and VSE is preferably performed after the pads are formed. As shown in FIG. 1A, pads 12, 15 are on the respective wafers are aligned. FIG. 1B shows the wafers upon placing the wafers together to contact the respective pads. At this stage, pads 12, 15 would be separable. In FIG. 1C, slight additional pressure is applied to the wafers to elastically deform one or both of the semiconductor wafers, resulting in contact between some of the non-metal areas on the wafers. The location shown of the contacting is an example, and the contact may occur at different locations. Also, the contact may occur at more than one point. This contact initiates chemical wafer-to-wafer bonding, and the bonded structure is shown in FIG. 1D. The bonding seam 16 expands after the initial chemical bonding to produce bonding seam 17 shown in FIG. 1D. The bond strength is initially weak and increases as the bonding propagates, as explained in U.S. Pat. Nos. 6,984,571; 6,902,987; and 6,500,694, which are incorporated by reference herein in their entirety. The opposing non-metallic regions are chemically bonded at room or low temperature.

In more detail, as the wafer surfaces including the metal bonding pads contact at room temperature, the contacting non-metal parts of opposing wafer surfaces began to form a bond at the contact point or points, and the attractive bonding force between the wafers increases as the contact chemical bonding area increases. Without the presence of the metal pads, the wafers would bond across the entire wafer surface. The presence of the metal pads, while interrupting the bonding seam between the opposing wafers, does not prohibit chemical wafer to wafer bonding. Due to the malleability and ductility of the metal bonding pads, the pressure generated by the chemical wafer-to-wafer bonding in the non-metal regions may results in a force by which nonplanar and/or rough regions on the metal pads may be deformed resulting in improved planarity and/or roughness of the metal pads and intimate contact between the metal pads. The pressure generated by the chemical bonding is sufficient to obviate external pressure to be applied in order for these metal pads to be intimately contacted to each other. A strong metallic bond can be formed between the intimately contacted metal pads, even at room temperature, due to inter-diffusion or self-diffusion of metal atoms at the mating interface. This diffusion is thermodynamically driven to reduce the surface free energy and is enhanced for metals that typically have high inter-diffusion and/or self-diffusion coefficients. These high diffusion coefficients are a result of a cohesive energy that is typically mostly determined by the mobile free electron gas that is not disturbed by the motion of metal ions during the diffusion. The wafer-to-wafer chemical bonding in the non-metal regions thus effects electrical connection between metal pads on the two different wafers. The geometrical and mechanical constraints governing this effect are described below.

Figure 2A:
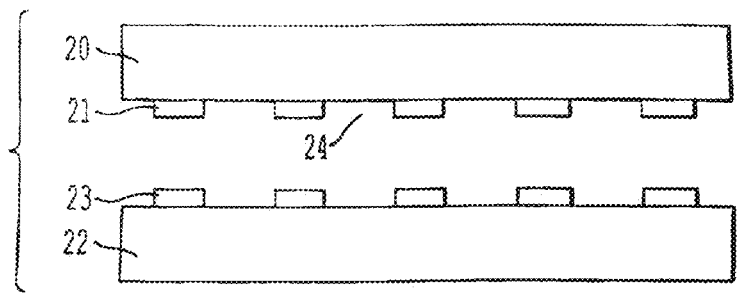
FIG. 2A is a schematic diagram illustrating bonding substrates with multiple bonding pads prior to bonding.
Figure 2B:
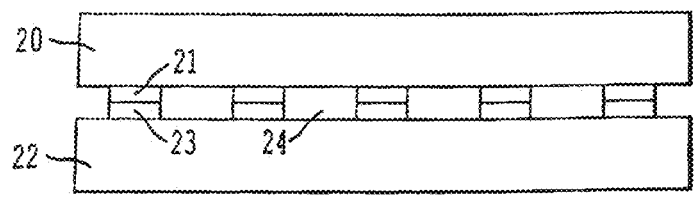
FIG. 2B is a schematic diagram of bonding substrates after the bonding pads are contacted.
Figure 2C:
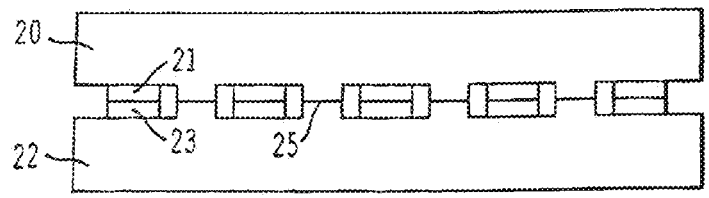
FIG. 2C is a schematic diagram of the bonding substrates as nonconductive regions are bonded.

An unbonded area around the bonding pad having a width W will be generated in which the non-metal surfaces of the two wafers are precluded from contacting (see FIG. 1D). As long as the thickness of metal films is not too large, the gaps between two bonding wafers or dies can be reduced, leaving a small unbonded area around each metal pad. This is illustrated in FIGS. 2A-2C, where wafer 20 with metal pads 21 is ready to be bonded to wafer 22 with pads 23. A lateral gap 24 is between adjacent pads. The metal pads are contacted (FIG. 2B) and the wafers elastically deform to bond in the gaps 24 to form bonds 25 (FIG. 2D). It is noted that the dimensions in FIGS. 2A-2C are not to scale.

The formula to calculate the width of the unbonded area as a function of metal film thickness, mechanical properties of the wafer or die, the wafer or die thickness, the bonding energy will be shown below. FIG. 2D is a graph showing the relationship between the gap height 2 h and the width w of an unbonded area. When the deformation of the wafers obeys an elastic constant given by Young's modulus E and the wafers each have a thickness of $t_w$, according to the simple theory of small deflection of a thin plate, the width W of the unbonded area can be roughly estimated by the following equation for $W \geq 2t_w$ where the metal bonding pads as a pair have a height of 2 h above the wafer surface:

$$W=[(2E't_w^3)/(3\gamma)]^{1/4}h^{1/2} \quad (1)$$

where E' is given by $E/(1-v^2)$ with v being Poisson's ratio.

It has been suggested that with decreasing h, the situation changes drastically. See, for example, U. Goesele and Q.-Y. Tong, Proc. The $2^{nd}$ Intl. Symposium on Semiconductor Wafer Bonding, the Electrochemical Soc. Proc. Vol. 93-29, p. 395 (1993). If W calculated by Eq. (1) leads to values below $W_{crit}=2t_w$, corresponding to $h<h_{crit}$ where $h_{crit}=5(t_w\gamma/E')^{1/2}$, then an elastomechanical instability is supposed to occur, leading to an unbonded area with much smaller W that is independent of wafer thickness $t_w$, and is given by:

$$W \approx kh \quad (2)$$

where k is a dimensionless constant on the order of 1. Experimentally, as shown in FIG. 2D, if h<300 Å, W is much smaller than what is predicted by Eq. (1). Further work by the inventors of the present application has shown that, if the spacing between metal bonding pad pairs 2 R is smaller than 2 W, the wafer pairs may not bond to each other. However, when 2 R>2 W, surfaces between the two unbonded areas around the metal posts will bond and the metal posts will be bonded and electrically connected.

The pressure P on the metal bonding pairs that is generated by the bonding of the surrounding area can be expressed as:

$$P=(16E't_w^3h)/(3W^4) \quad (3)$$

Combining Eq. (3) with Eq. (1) or (2), when $W>2t_w$, the following is obtained:

$$P=8\gamma/3h, \quad (4)$$

and when $W<2\ t_w$, the following is obtained:

$$P=(16E'tw3)/(3k4h3) \quad (5)$$

For bonded silicon wafers where the metal pads have height h of 500 Å and the bonding energy is 300 mJ/m², the compressive pressure on the metal bonding pads is about $1.6\times10^8$ dynes/cm², i.e., 160 atmospheres. Since this pressure is sufficiently high for metal bonding, there is no need to apply any external pressure during bonding. When metal height h is 300 Å or less, $W<2t_w$ is satisfied and the pressure on the metal pairs is in the order of 5000 atmospheres if k=1 is assumed.

In one example, 5 mm diameter Au bonding pads with a thickness less than 300 Å and a separation distance of 1 mm were deposited on oxide covered 100 mm silicon wafers. Since the Au bonding pads were formed on the surface of the oxide, they also had a height of 300 Angstroms above the surface of the oxide. However, h can be much smaller than actual metal thickness because metal can be partially buried in oxide or other insulator and h is the height the metal extended above the die surface. A room temperature bonding technology has been developed that cleans and activates the metal and the oxide surfaces compatibly and simultaneously. The Au posts formed a metallic bond by room temperature bonding at wafer level in ambient without using external pressure after storage in air for a period of time, e.g. 60 hr depending on the metal thickness and bonding energy. When the wafer pairs were forcibly separated, by inserting a wedge between the bonded interface, either the Au or the Au/oxide layer peeled from the silicon substrate, indicating that the metal-to-metal bond formed was stronger than the adhesion of the Au pad on the oxide surface or the oxide on the silicon surface. As mentioned above, a strong metallic bond can be formed between the intimately contacted metal pads at room temperature due to inter-diffusion or self-diffusion of metal atoms on the mating interface to reduce the surface free energy. The inter-diffusion or self-diffusion coefficient between metal atoms increases exponentially with temperature, in order to shorten the storage time to achieve full metallic bonding, annealing can be performed after room temperature bonding. The preferred annealing time for metallic bonding between the Au posts shortened as the temperature increased. For this case, 5 hr was preferred for 100° C., 1 hr for 150° C., and 5 min for 250° C. Thinner metals can be bonded at lower temperatures than thicker metals due to higher pressure generated by the bonding of non-metal surrounding areas. The time for the formation of metallic bonds at room temperature and at elevated temperatures becomes longer as the Au thickness (i.e., height) increases. For example, when the thickness of Au pads h is 600 Å, 5 min at 250° C. will form metallic bonds while at h=500 Å, 15 min at the same temperature will form metallic bonds.

In flip-chip bonding of state-of-the art integrated circuits, the solder ball pitch is about 1000 μm. Therefore, an unbonded area width around the bonded metal posts that is comparable or less than 1000 μm is sufficiently small for practical applications. Unbonded area widths substantially less than this amount can be obtained by this method. For example, experimental results show that when h=200 Å, W is 20 μm, and when h=300 Å, W is 30 μm. Because h is the height the metal extended above the die surface, h can be much smaller than actual metal thickness since metal can be partially buried in oxide or other insulator, h less than 200 Å can be readily achieved. In this case the unbonded ring width around the metal pads can be close to zero. The metal pad described above may be formed by processes such as, but not limited to, sputtering, evaporation, laser ablation, chemical vapor deposition, and other techniques know to those skilled in the art in which thickness control in the <100 Å range is typical.

Figure 3A:
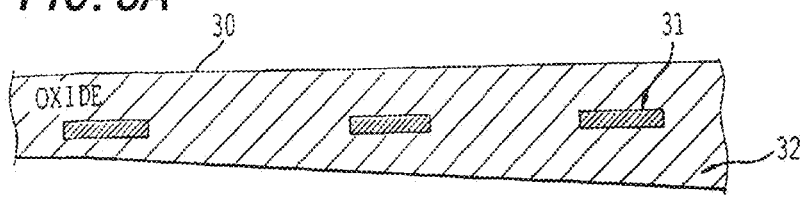
FIG. 3A is a schematic depiction of semiconductor die or wafer after surface planarization.
Figure 3B:
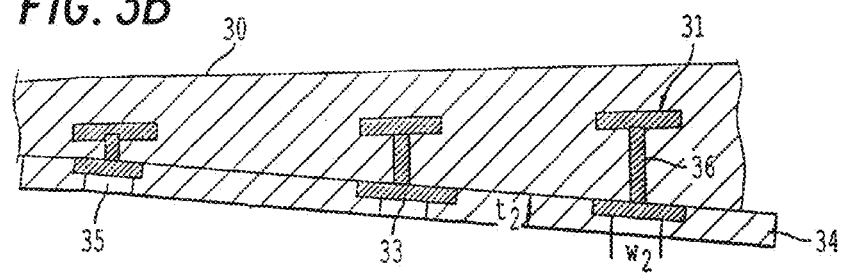
FIG. 3B is a schematic depiction of semiconductor die or wafer in which second metal layer are formed and planarized with contact windows opened on metal pads.
Figure 3C:
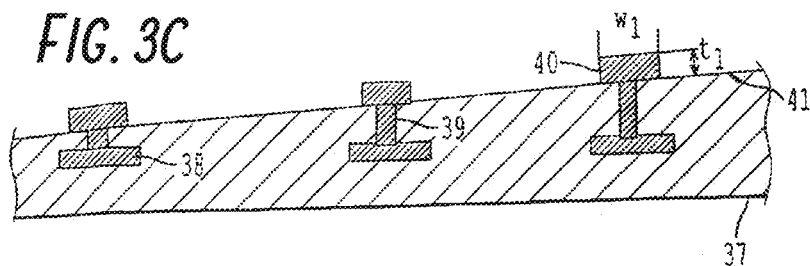
FIG. 3C is a schematic depiction of second semiconductor die or wafer with a second metal layer.

FIGS. 3A-3C are schematic drawings of a process according to a second embodiment, by which two different fully processed dies are bonded. The dies are shown to have planar but uneven layer thickness, to demonstrate that the disclosed embodiments may be used in other instances other than even and planar layer thicknesses. In this process, as shown in FIG. 3A, a separate die 30 (only the oxide layer of die 30 is shown, for convenience of explanation) has metal pads 31. The die may be a silicon wafer including semiconductor devices and circuits have opposing surfaces of $SiO_2$. Surface 32 results after a CMP operation.

As shown in FIG. 3B, vias 36 have been formed and filled with metal to connect with metal pads 31, metal interconnects 33 are formed on wafer 30 to connect with the metal in vias 36, and a layer 34 of thickness $t_2$, of $SiO_2$ or other insulating material is formed on wafer 30. Portions 35 of the $SiO_2$ layer having a width $w_2$ have been removed to expose metal pads 35. The surface of layer 34 is treated as described in U.S. Pat. Nos. 6,984,571; 6,902,987; and 6,500,694, including polishing or polishing and slightly etching.

Figure 3D:
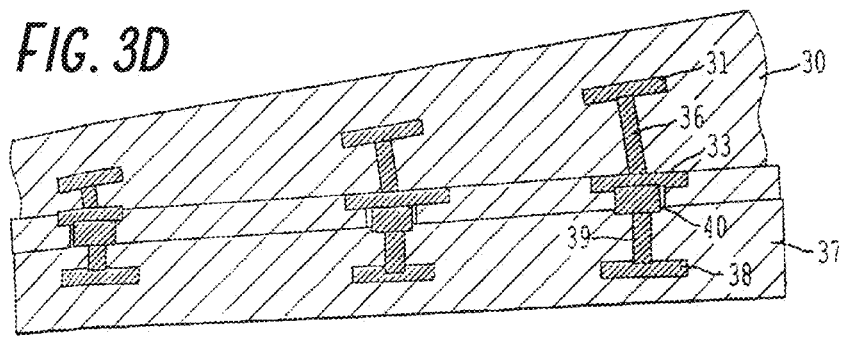
FIG. 3D is a schematic depiction of an aligned metal bonding of two dies or wafers.

In FIG. 3C, a second wafer 37 has pads 38, vias 39 filled with metal, and interconnects 40 formed as shown. Interconnects 40 have a width $w_1$ and a height $t_1$. Surface 41 of wafer 37 has been treated like surface 32, as discussed above. The separate dies 30 and 37 are aligned and contacted one to another to produce the bonded structure shown in FIG. 3D. With the following relationships:

$$t_1=t_2+\delta_1 \text{ and } w_1=w_2+\delta_2.$$

where $t_1$ and $\delta_1$ are preferred to be the minimum thickness possible for the deposition technology used, and $\delta_2$ should be 2 W corresponding to the case of 2 h=$t_1$. Compared with h=$t_1$ on both dies to be bonded, unbonded area width W is significantly reduced. Thus interconnection between the pads on wafers 30 and 37 is made. If $t_1$ on both dies is less than the critical thickness $h_{crit}$ then layer 34 can be omitted.

During the initial contacting of the two wafers at room temperature, the metal pads are aligned, and the surfaces of the wafers conform to each other by elastic deformation, when the gap due to the surface topography of bonding wafers is sufficiently small and the bonding energy γ is sufficiently high. Direct bonding occurs between the contacted materials forming the metal interconnects between devices or circuits on adjoining dies and between the wafer surfaces. The bond begins to form on contact and the bond strength increases, at room temperature, to form a metallic bond.

As in the first embodiment, wafer surfaces 32 and 41 including metal pads 33 and 40 contact, the contacting non-metal (e.g., semiconductor or insulator) parts of opposing wafer surfaces 32 and 41 began to form a bond at the contact points, and the bonding force increases as the contact bonding area increases. Without the presence of protruding metal pads 33 and 40, the wafers would bond across the entire wafer surface. The presence of protruding metal pads 33 and 40, while interrupting the bonding seam between the opposing wafers, does not prohibit wafer to wafer bonding. Rather, the pressure generated by the wafer-to-wafer contact in the non-metal regions translates into a force by which metal pads 33 and 40 are contacted even without any external pressure.

The method can be carried out in ambient conditions rather than being restricted to high or ultra-high vacuum (UHV) conditions. Consequently, the method is a low-cost, mass-production manufacturing technology. The size of metal films to be bonded is flexible and scalable to very small geometries because direct metallic bonding depends only on inter-molecular attraction force.

Direct metal bonding is preferable for better thermal management and power capability of semiconductor devices. The direct metal bonding can replace flip-chip bonding with much smaller bonding pads that are scalable. It is further possible that this metal bonding can be used to realize novel metal base devices (semiconductor-metal-semiconductor devices) see for example, T. Shimatsu, R. H. Mollema, D. Monsma, E. G. Keim and J. C. Lodder, IEEE Tran. Magnet. 33, 3495 (1997).

Further, the process is compatible with VLSI technology. The direct metal-to-metal bonding may be performed when wafers are fully processed. The direct metal-to-metal bonding also utilizes relatively low or room temperature bonding to minimize effects from the difference in thermal expansion, since almost all metals have significantly higher thermal expansion coefficients than semiconductor and insulators, such as those noted above (e.g., silicon or silicon dioxide).

The methods described herein can bond locally or across an entire wafer surface area. The methods, while not limited to the following examples, bond heterogeneous surfaces such that metal/metal, oxide/oxide, semiconductor/semiconductor, semiconductor/oxide, and/or metal/oxide regions can be bonded between two wafers at room temperature.

Numerous advantages are offered. For example, other methods of wafer bonding and electrically interconnected constituent electrical contacts require thinning of bonded substrates, via etching and metal deposition after wafer bonding. The methods described herein allow electrical interconnections even without such post-bond process steps, allowing the elimination of mechanical damage caused by the die thinning. Furthermore, the elimination of deep via etching avoids step coverage problems and allows the electrical connection to be scaled to smaller dimensions, resulting in an electrical interconnection with a smaller footprint and reduced electrical parasitics between bonded wafers. The method is compatible with other standard semiconductor processes, and is VLSI compatible.

As such, the methods described herein are compatible with 3-D SOC (three-dimensional system-on-a chip) fabrication. This vertical metal bonding of metal pads or interconnects using plugs between bonded dies significantly simplifies the SOC fabrication process and improves the SOC speed-power performance. The direct metal-to-metal bonding described herein is scalable and can be applied to multi-die stacking SOC.

Besides generation of force sufficient to form metal-to-metal connections, the methods facilitate low resistance metal bonding by oxide-free or nearly oxide-free surfaces of the metal bonding metal pads. For example, Au surface can be cleaned by ultraviolet/ozone and nitrogen plasma with no oxide left on the surfaces.

In another embodiment, the surfaces of the bonding metal pads (fabricated for example from metals such as Al or Cu) are coated with oxidation resistant metals, such as for example with gold (Au) or platinum (Pt) layer. Since both Au and Pt are inert metals, no oxide will be formed on the surfaces. To ensure that there is a minimum amount of oxide between Au or Pt and the host metal, sputter cleaning and evaporation deposition are employed, preferably immediately prior to the bonding process.

In a modification of the first embodiment, a thin metal overcoat layer may be formed on the metal pad and bonded as described above. For example, a layer as thin as 50 Å of an Au layer on an Al pad produced successful metal pad bonding at room temperature. Therefore, metals such as Au can be used as a bonding layer, enabling almost all metals to be utilized for direct bonding at room temperature by the foregoing methods. When an insulator layer is deposed on a fully processed wafer and contact openings are formed on the metal pads followed by a metal deposition with thickness 100 Å more than the depth of the contact windows, the metal pads now are extended above oxide layer only 100 Å, the pads can be separated each other by a very small distance, e.g. 20 μm.

Besides Au or Pt, palladium (Pd) has been utilized in the direct bonding described herein as an overcoat layer because Pd has good oxidation resistance. The surface diffusivity of Pd on Pd is very high resulting in a significant mass transport of Pd even at room temperature, especially given the contacting pressures exerted on the metal bonding pads by the bonding of the non-metal wafer surface regions. The native oxide between the two Pd bonding layers, if any, will be mechanically dispersed allowing complete coverage with Pd of the physical interface between the two contacted metal bonding pads.

In another modification of the first embodiment, a UV/ozone cleaning exposes the surfaces of the metal bonding pads to high ozone concentrations under a UV light to remove hydrocarbon contamination. Residual hydrocarbons on the surfaces of the metal bonding pads degrade metal bonding, and are nucleation sites for bubble formation between the bonding interfaces, resulting in out-gassing between the contacted surfaces.

Experiments have shown that UV/ozone treatments can prevent interface bubble formation. An HF dip of silicon wafers leads to hydrophobic surfaces that are terminated mostly by H. The hydrophobic silicon wafers are treated with 4.77 g/m³ of ozone concentration combined with 1850 Å and 2540 Å UV irradiation from two 235 W UV lamps at room temperature for 15 min. followed by a second HF dip and bonding. The bonded pairs of HF dipped hydrophobic silicon wafers generated no interface bubbles upon annealing from 300° C. to 700° C. for 15 hrs at each temperature clearly indicating the effective removal of hydrocarbons from the wafer surfaces.

For Au and Pt, it is adequate to use UV/ozone cleaning before bonding without formation of metal oxide on the metal surfaces. For other metals that can be oxidized by ozone, a thin layer of Au on the metals can prevent oxidation, or the oxide can be removed by, for example, immersion in $NH_4OH$ before bonding. In addition, plasma treatment with inert and/or nitrogen-containing gases, for example plasma treatments in a reactive ion etch mode (RIE) with gases such as nitrogen and argon in the plasma chamber, can clean metal surfaces and enhance the bonding energy at room temperature for both metal/metal and oxide/oxide bonds. Further, an oxygen plasma can be used to remove contamination from the surface of metals such as Au and Pt.

Figure 4A:
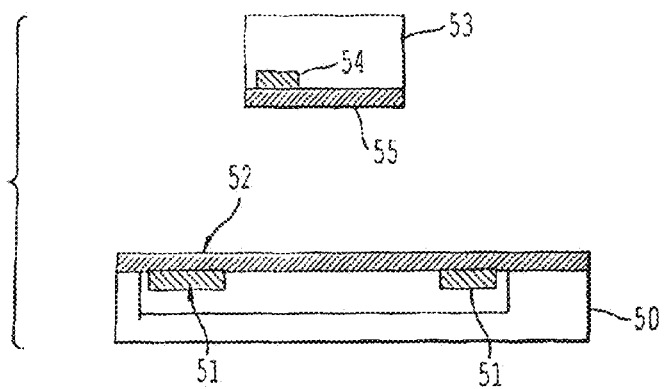
FIG. 4A is a schematic depiction of a part of a substrate showing imbedded metal pads in an oxide coating.
Figure 4B:
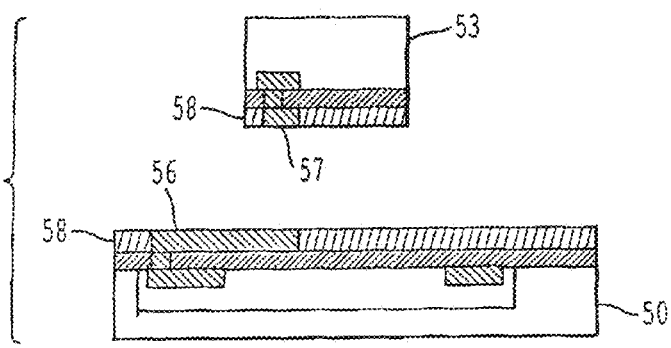
FIG. 4B is a schematic depiction of a pair of unbonded substrates having reciprocal metal bonding pads.
Figure 4C:
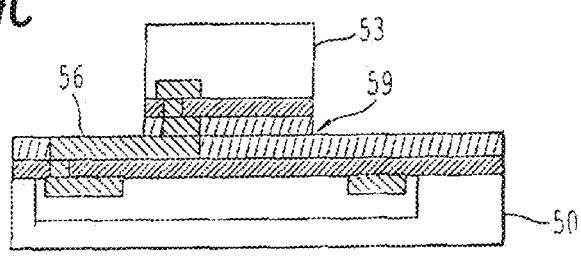
FIG. 4C is a schematic depiction of a pair of bonded substrates showing the reciprocal metal bonding pads contacted by the forces generated when the non-metal regions contacted and bonded.

While numerous surface preparation treatments and metal/metal and oxide/oxide and semiconductor/semiconductor examples have been described, other surfaces and preparation procedures could be used in which the corresponding metal, insulator, and semiconductor surfaces are sufficiently cleaned prior to contact such that the formation of room temperature bonding is not inhibited. In the case of Au protection or Au bonding, the process is metal and silicon dioxide compatible. After CMP and surface planarization and smoothing of the oxide surfaces, metal bonding pads are formed on bonding wafers as described above, a modified RCA 1 ($H_2O:H_2O_2:NH_4OH=5:1:0.25$), UV/ozone, and plasma treatment clean the surfaces of both metal and oxide without roughening the bonding surfaces. A room temperature standard 29% $NH_4OH$ dip removes particles and oxide on the metal surfaces if any without degrading the silicon dioxide surfaces. After spin-drying and room temperature bonding and storage, strong covalent bonds and metallic bonds are formed spontaneously at bonding interfaces between oxide layers and between metal surfaces, respectively. Besides the near planar bonding structures shown in FIGS. 1A-1D, other structures can also utilize the principles described herein. For example, a second embodiment is shown in FIGS. 4A-4C, where wafers including metal via interconnections are bonded to a smaller die. FIG. 4A depicts a magnified view of a substrate 50 including metal interconnects 51. In FIG. 4A, the metal interconnects are embedded in a silicon dioxide layer 52 such as a PECVD oxide, thermal oxide, or spin-on glass. Interconnects 51 extend above the layer 52 to a height as discussed previously. FIG. 4A also shows smaller die 53 having metal contact 54 and silicon dioxide layer 55.

Following forming an insulating layer 58 on both dies of a material such as silicon dioxide, a standard via etch and metal fill, followed by chemical mechanical polish and surface treatment are used to prepare the layers 58 for bonding. FIG. 4B depicts a pair of opposing wafers with reciprocal metal bonding pads 56 and 57. FIG. 4C shows the contacting and subsequent bonding of these two opposing substrates, forming bond 59.

Figure 4D:
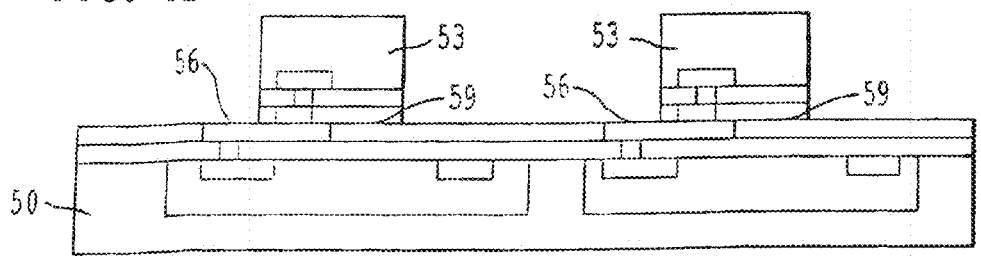
FIG. 4D is a schematic depiction of a pair of smaller substrates bonded to a larger substrate.

Here, as before, the bonding of the non-metal regions generates the requisite forces to form the metal-to-metal interconnections across the dies. As depicted in FIG. 4C, the bonding of the oxide layers generates the requisite bonding force for direct metal-to-metal contact of the metal bonding pads 56 and 57. A plurality of dies 53 may be prepared and bonded to die 50, as shown in FIG. 4D.

In the metal-to-metal direct bonding of the first and second embodiments, the thickness of bonding metal films extended above die surface is preferably thin to minimize the unbonded ring area around the metal posts. Further, the thickness of bonding metal pads is scalable, and VLSI compatible size metal posts or pads can be made and bonded. When the metal film thickness is below a certain value, the width of the unbonded ring area is significantly reduced so that the spacing between metal posts permits small spacing (e.g. <10 µm) between the metal bonding pads to be used.

A third embodiment allows a significant increase in the metal height above the non-metal surface and/or significant reduction in non-bonded area near the metal while maintaining an acceptable electrical connection between metal portions formed on separate wafers. In this embodiment, deformation of material in the vicinity of the metal material that forms the electrical contact is designed to result from the pressure at the metal surfaces from the wafer-to-wafer chemical bonding of the non-metal portions. This deformation may result in less pressure applied to the metal after the bonding process is complete, but adequate pressure to form an acceptable electrical connection between the metal portions. This deformation allows the gap near the metal surfaces to be significantly reduced or eliminated.

The object of the deformable material in the vicinity of the metal material forming the electrical contact is to allow the pressure generated by the chemical bonding of the non-metal surfaces to be sufficient to recess the metal material sufficiently into its respective surface so that the gap near the metal surface can be significantly reduced or eliminated. In general, the deformable material is comprised of non-metal portions because the pressure generated by the wafer-to-wafer chemical bonding is typically about one part in 10,000 or 1% of 1% of that required to deform typical metals. The recess of the metal into its respective surface allows the starting height of the metal surface above the non-metal surface to be substantially higher than after the recess. This significantly increases the tolerances of the metal surface required to prepare the wafers for bonding and subsequently the manufacturability of the embodiment. The deformation also substantially reduces or eliminates the non-bonded region around the metal allowing a substantial increase in the number of connections that can be made in a given area and increasing the bond strength of the bonded and interconnected parts.

Figure 5A:
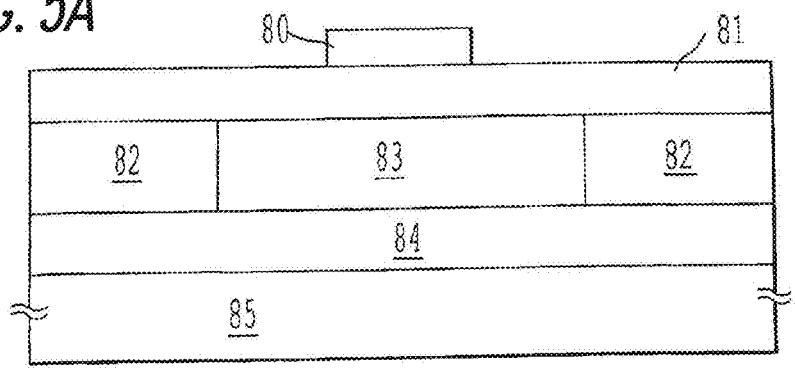
FIG. 5A is a schematic diagram of an embodiment having a deformable material or void beneath the metal pad.
Figure 5B:
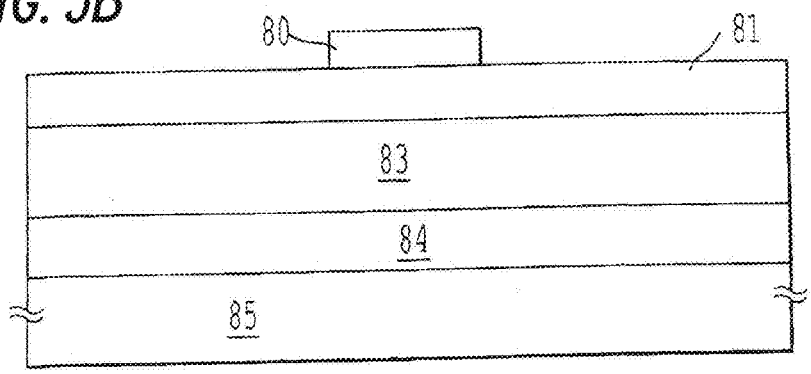
FIG. 5B is a schematic diagram of an embodiment having a deformable material beneath the metal pad.

The deformation can be facilitated by the inclusion of a non-metal region underneath the metal surface, as illustrated in FIG. 5A. A die with a substrate 85 has a metal pad 80 formed on a layer 81 that is to be bonded to a corresponding layer on another device. Region 83, filled with a deformable non-metal material such as a low K dielectric material, is formed in layer 82 by standard photolithography, etching and deposition techniques. Layer 82 and region 83 are formed on layer 84. Any number of layers may be formed on substrate 84. Also, region 83 may be much larger or layer 82 may be formed of the low K material, as shown in FIG. 5B.

Figure 5C:
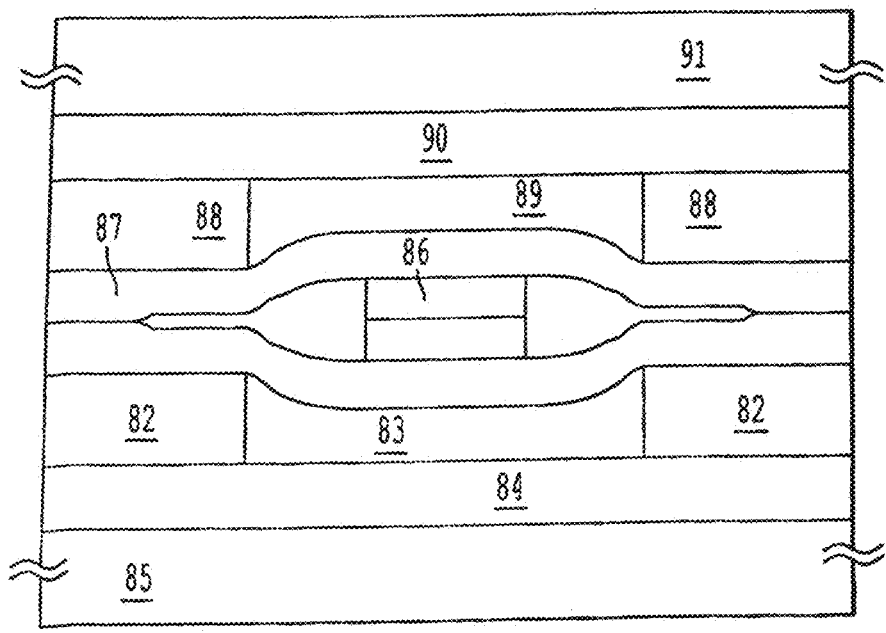
FIG. 5C is a schematic diagram of two devices as shown in FIG. 5a bonded together.

Region 83 may also be a void containing a vacuum or compressible gas like air, or it may be a compressible non-gas solid material with a sufficiently low compressibility that the pressure generated by the bonding will deform the metal into the region. The void may be formed in a manner similar to that used to fabricate metallic air bridges common in compound semiconductor integrated circuit fabrication. One example of this fabrication is as follows: 1)

etch a recess in a planar, non-metal surface, 2) fill the recess with a removable material like photoresist such that the removable material is in the recess, but not outside the recess. This may, for example, be done by conventional spin coating of photoresist, resulting in a thicker photoresist in the recess than outside the recess, followed by blanket (non-patterned) etching of the photoresist of an amount sufficient to remove the material outside the recess but not sufficient to remove the material in the recess, 3) patterning a metal feature that transverses the recess but does not entirely cover the recess, leaving an exposed portion of the recess, and 4) removal of the removal material in the recess by accessing the exposed portion of the recess. An example of a compressible non-gas solid material is a low K dielectric used in semiconductor manufacturing. The depth of this region is typically comparable to or greater than the desired height of metal above the non-metal surface. Another die to which the die of FIG. 5A is to be bonded may also have a region such as region 83 in a corresponding position beneath a metal pad to be bonded to pad 80. This is illustrated in FIG. 5C, where it is noted that FIG. 5C is a schematic drawing and is not shown to scale. Here, pads 80 and 86 are bonded by the compressive force generated by bonding of layers 81 and 87. The upper die in FIG. 5C includes a substrate 91 with pad 86 formed over void or low K material region 89 in layer 88. Layer 88 is formed on layer 90. Again, the upper die may have many layers.

In this embodiment, when the wafers are bonded, the metal surfaces are contacted and deformation with respect to each other occurs during the chemical bonding process. The deformation relieves some of the pressure applied by the bonding process, but sufficient pressure remains to maintain the metal surfaces in contact and maintain an acceptable minimum contact resistance between the two metal surfaces on the two separate wafers. As the metal deforms into the region under the metal, the bonding surfaces are allowed to come into contact in a lateral annulus very close or immediately adjacent to the metal, resulting in a maximum bonding area between the non-metal surfaces. A minimum chemically-non-bonded region of 1-10 microns, or less, adjacent to the metal contact, can thus be formed by the disclosed embodiments.

The deformable region is designed to have a minimum width to maximize the number of possible electrical interconnections. The deformable region width primarily depends on the metal thickness and the metal height above the non-metal surface. These parameters are approximately determined by the following relations.

$$\text{Stress}=(2/3)*(\text{Young's Modulus of Metal})(1/1-\text{Metal Poisson's Ratio})*(\text{metal height above surface/half width of region})^2$$

and $$\text{Pressure}=\text{Stress}*4*\text{metal thickness}*\text{metal height above surface}/(\text{half width of region})^2$$

Where the pressure is that generated by the bonding process. A reference for these relations can be found in the "Handbook of Thin Film Technology", Maissel and Glang, 1983 Reissue, pp. 12-24.

For example, for a metal thickness of about 0.1 micron and a metal height above the region of about 0.1 micron above the surface and a region width of about 1 micron, the pressure generated during bonding is approximately sufficient to deform the metal into the region (assuming compressibility of the region can be neglected). Note that this 0.1 micron metal height would have resulted in an unbonded annulus or ring width around the metal of about 1 mm if the metal was not deformable. The manufacturability is thus increased substantially by requiring less control of the metal height above the non-metal surface. Furthermore, the non-bonded area is substantially decreased allowing a significant increase in the number of metal to metal contacts that can be made and resulting in an increase in the chemical bonding energy. If the compressibility of the region cannot be neglected, then the thickness of the metal should be reduced accordingly and/or the metal height above the non-metal surface should be reduced accordingly and/or the width of the region should be increased accordingly. Note that the percentage amount the width of the region should be increased is less than the percentage amount the metal height above the non-metal surface, or the metal thickness, should be reduced.

A fourth embodiment further relaxes the mechanical design constraints in the vicinity of the metal contacts described in the first, second, and third embodiments by relying on a low temperature, post-bond reflow anneal to form reliable electrical interconnections between chemically bonded wafers. A description of this embodiment is provided with reference to FIGS. 6A-C and 7A-C.

Figure 6A:
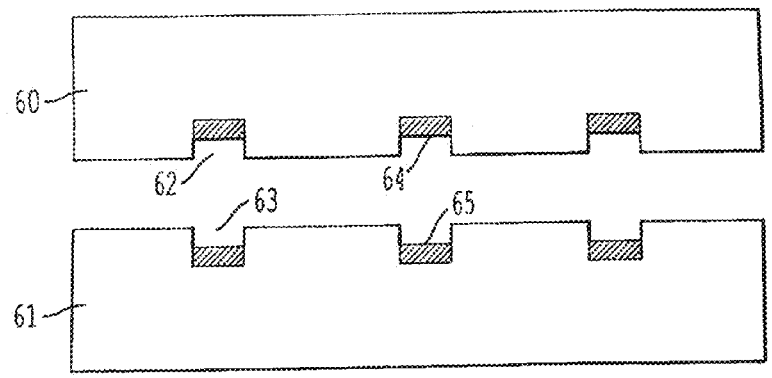
FIG. 6A is a schematic diagram of an embodiment having reflowable metal material exposed to the surface on two devices prior to direct wafer bonding of the non-metal surfaces.

FIG. 6A shows substrates 60 and 61 with planar surfaces. Recesses 62 and 63 are formed in substrates 60 and 61, respectively, and metal pads 64 and 65 are formed in recessed 62 and 63 respectively. The planar surfaces are suitable for chemical bonding as described previously. The metal or combination of metals making up pads 64 and 65 can reflow at low temperatures. Examples of such a metal is indium that reflows at a melting temperature of 160 degrees C., and such a combination of metals is 96.5% tin and 3.5% silver that reflows at a eutectic melting temperature of 220 degrees C.

After the surfaces in FIG. 6A are prepared for direct chemical bonding and the surfaces are placed together, a chemical bond is formed between the planar surfaces. Compared to embodiments 1 and 2, there is no gap near the metal contacts because the contacts are recessed, although a reliable electrical interconnection is not yet made.

Figure 6B:
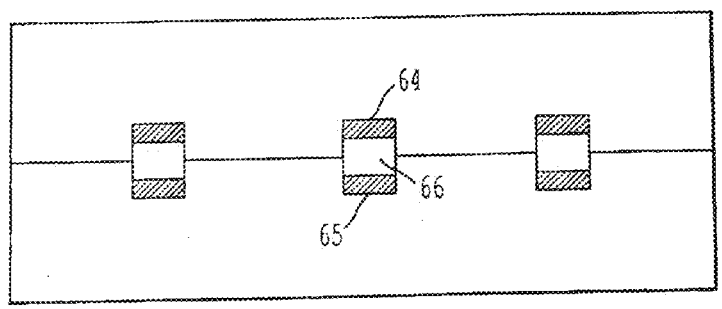
FIG. 6B is a schematic diagram of an embodiment having reflowable metal material sealed by after direct wafer bonding of the non-metal surfaces.
Figure 6C:
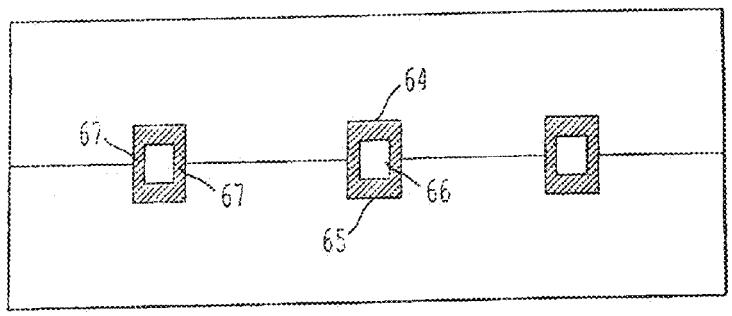
FIG. 6C is a schematic diagram of an embodiment having reflowable metal reflowed after direct wafer bonding of non-metal surfaces sealed the reflowable metal.

After the chemical bond in FIG. 6B has been formed, a void 66 is formed by partially metal-filled recesses from both wafers. This void does not impede the wafer surfaces from coming together and forming a chemical bond like the metal contacts do in the first and second embodiments. A maximum bond area is thus realized that maximizes the bond energy. After this high bond energy chemical bond has been formed, a low temperature reflow anneal reflows the metal in the recesses resulting in wetting of the metal from the opposing wafers together and resulting in an interconnected metal structure with high reliability. Portions 67 are formed by the reflow to connect pads 64 and 65. This reflow is assisted with a combination of capillary action for recesses with high aspect ratios and gravity as, for example, if the wafers are rotated during the anneal.

In a fifth embodiment, similar to the fourth embodiment, one of the surfaces in FIG. 6A has the metal recesses replaced with metal plateaus, such that the height of the metal plateau above the planar surface on one wafers is less than the depth of the metal recess below the planar surface on the other wafers as shown in FIG. 7A. Substrates 70 and 71 have respective metal pads 72 and 73. Pads 72 are formed in recesses 74. In this case, the metal surfaces do not, in general, touch after the planar surfaces forming a chemical bond are placed in contact as shown in FIG. 7B. The surfaces of substrates 70 and 71 are prepared for direct chemical bonding and the surfaces are placed together as in the above example, and a chemical bond is formed between the planar surfaces (FIG. 7B). After reflow, the metal on the two different wafers is wetted together, forming portions 75, in a manner similar to FIG. 6C, resulting in FIG. 7C.

Hence, the embodiments described herein offer numerous advantages and distinctions from prior low temperature wafer bonding techniques. The metal to metal direct bonding is spontaneous and requires no external forces at room temperature. The pressure applied on the metal posts that is required for metal-to-metal bonding is generated by bonding process itself, and not external forces. The metal-to-metal direct bonding described above can be performed under ambient conditions and the following are realized: wafer level or die size bonds, strong metallic Au—Au, Cu—Cu or metal-to-metal bonds formed at room temperature, and strong metallic bond of metals other than Au and Cu can be formed at room temperature by covering the metals with a ~50 Å Au layer. Thus, simultaneous bonding of metal/metal, oxide/oxide and metal/oxide can be achieved. The metal-to-metal direct bonding is compatible with standard VLSI processing and therefore, is a manufacturable technology. The metal to metal direct bonding is compatible with bonding of materials covered with silicon oxides, silicon, or silicon nitride. In various embodiments, the metal to metal direct bonding is compatible with bonding of materials covered with at least one of glass, silicon-on-insulator, silicon carbide, sapphire, germanium, gallium arsenide, gallium nitride, polymers, indium phosphide, or any other suitable material.

Facilitating the metal-to-metal direct bonding is the direct bonding of the non-metal regions proximate to the metal bonding pads. As previously discussed, it is the direct bonding in these regions that generates the resultant force on the opposing metal bonding pads. The direct bonding of the non-metallic regions covalently bonds in air silicon dioxide or other insulator covered wafers, e.g., wafers covered with at least one of glass, silicon-on-insulator, silicon carbide, sapphire, germanium, gallium arsenide, gallium nitride, polymers, indium phosphide, or any other suitable material. Other materials can be utilized, for example, fluorinated oxide surface layers that may also be dipped in an ammonia solution prior to bonding. More generically, any material with an open structure surface that can be terminated by OH, NH or FH groups, and porous low k materials when brought into contact at room temperature can form a covalent bond.

Silicon dioxide formed by any method such as deposition, thermally or chemically oxidation, and spin-on glass, can be used in pure or doped states.

Applications include but are not limited to vertical integration of processed integrated circuits for 3-D SOC, micropad packaging, low-cost and high-performance replacement of flip chip bonding, wafer scale packaging, thermal management and unique device structures such as metal base devices.

Figure 8A:
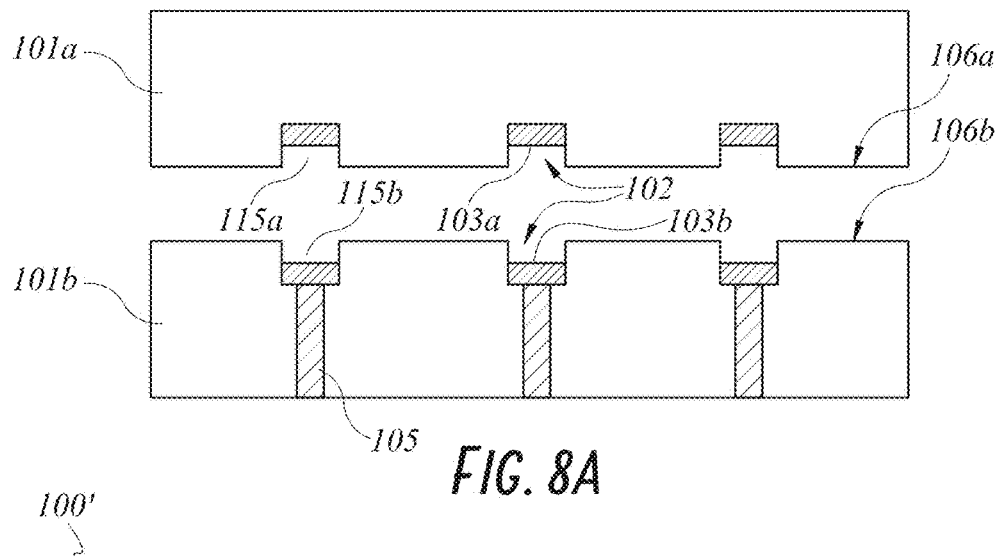
FIG. 8A is a schematic side cross-sectional view of a first semiconductor element and a second semiconductor element before the two elements are brought together.

FIG. 8A is a schematic side cross-sectional view of a first semiconductor element 101a and a second semiconductor element 101b before the two elements 101a, 101b are brought together. The semiconductor elements 101a, 101b can comprise corresponding non-metallic bonding regions 106a, 106b and conductive contact structures 102 having contact features 103a, 103b. As shown in FIG. 8A, the contact features 103a, 103b can be disposed below the bonding surfaces 106a, 106b such that corresponding recesses 115a, 115b are formed in the semiconductor elements 101a, 101b. The contact features 103a, 103b can be formed in the recesses 115a, 115b in any suitable manner. For example, in some embodiments, the recessed contact features 103a, 103b can be formed using a damascene process. In such damascene processes, one or more trenches can be formed in the semiconductor element 101 (e.g., by etching), and conductive material can be supplied in the trenches. The conductive material over field regions can be polished or otherwise removed to as to form the recessed contact features 103a, 103b of FIG. 8A.

The contact features 103a, 103b can comprise any conductive materials suitable for the embodiment of FIGS. 9A-9B described below. The bonding regions 106a, 106b and contact features 103a, 103b can comprise any materials suitable for use with the embodiment of FIGS. 9A-9B described below. As explained below, the bonding regions 106a, 106b can be prepared for direct bonding. For example, as explained with respect to the embodiment of FIGS. 9A-9B, the bonding regions 106a, 106b can be polished, very slightly etched, and/or terminated with a desired species (such as nitrogen). Moreover, as shown in FIG. 8A, interconnects 105 (e.g., TSVs) can connect the contact feature 103b to the exterior of the semiconductor element 101b to provide electrical communication to the larger electrical system. Furthermore, although not shown, there may be additional layers of internal metallization between the interconnects 105 and the contact feature 103a. The metallization and/or interconnects 105 can be formed before or after bonding the two elements 101a, 101b together. Additional details may be found at least in U.S. Pat. No. 7,485,968, which is incorporated by reference herein in its entirety and for all purposes.

Figure 8B:
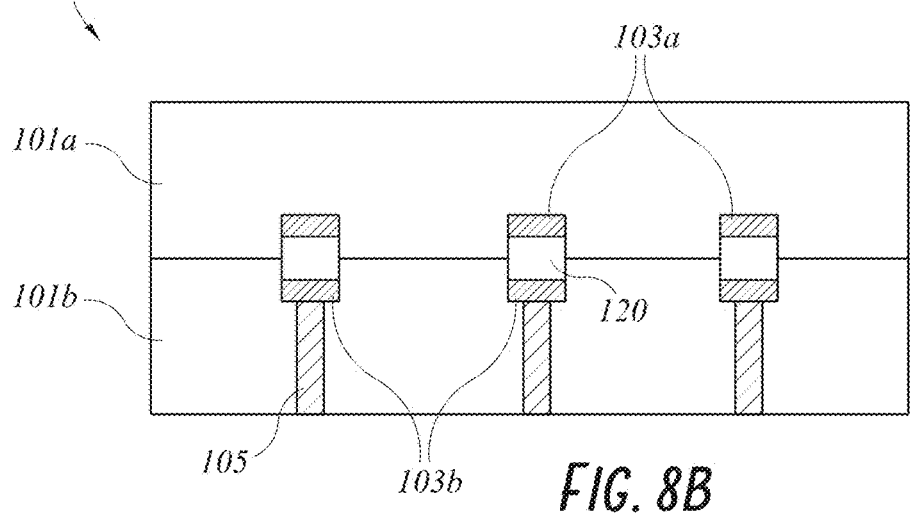
FIG. 8B is a schematic side cross-sectional view of an intermediate bonded structure after the bonding regions are directly bonded together.

FIG. 8B is a schematic side cross-sectional view of an intermediate bonded structure 100' after the bonding regions 106a, 106b are directly bonded together. When the bonding regions 106a, 106b are brought into contact, the bonding regions 106a, 106b can be directly bonded together so as to form a chemical bond (e.g., a covalent bond) without an intervening adhesive. As explained above, the direct bonding can be conducted at room temperature and/or without the application of external pressure. After the bonding regions 106a, 106b are directly bonded together, there may remain an initial gap 120 between the corresponding contact features 103a, 103b. It will be understood that such a gap 120 can also be achieved after contacting the bonding regions 106a, 106b even if the contacts on one side protrude, as shown in FIG. 7B.

Figure 8C:
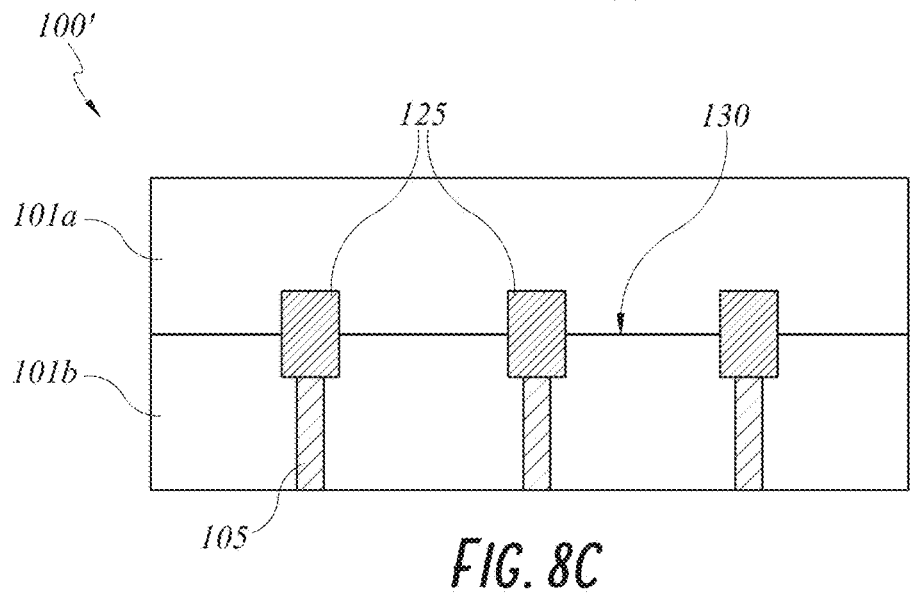
FIG. 8C is a schematic side cross-sectional view of a bonded structure after the contact features are directly bonded together.

FIG. 8C is a schematic side cross-sectional view of a bonded structure 100 after the contact features 103a, 103b are directly bonded together. In various embodiments, for example, the semiconductor elements 101a, 101b can be heated after directly bonding the nonconductive bonding regions 106a, 106b. In various embodiments, the semiconductor elements 101a, 101b can be heated in a range of 75° C. to 350° C., or more particularly, in a range of 100° C. to 250° C. Heating the semiconductor elements 101a, 101b can increase the internal pressure of the contact features 103a, 103b and can cause them to expand to fill the gap 120. Thus, after the contacts features 103a, 103b are directly bonded together, the contact 125 can substantially fill the void between the two semiconductor elements 101a, 101b.

As shown in FIG. 8C, the first bonding region 106a can be directly bonded to the second bonding region 106b along an interface 130. The interface 130 between the first bonding region 106a and the second bonding region 106b can extend substantially to the first and second contact features 103a, 103b, i.e., to the directly bonded contact 125. Thus, as shown in FIG. 8C, after the contact features 103a, 103b are bonded together, there may be no gap between the contact feature 103a, 103b and the proximate bonding regions 106a, 106b. Unlike the embodiments of FIGS. 1A-5C, the elements may exhibit no plastic deformation surrounding the contacts 125.

The distance below the bonding regions 106a, 106b of the semiconductor elements 101a, 101b can be less than 20 nm and preferably less than 10 nm. Bonding followed by temperature increase may increase the internal pressure between contact features 103a, 103b as described above and can result in improved metal bonding, metal contact, metal interconnect, or conductance between contact structures 102. The slight distance of contact features 103a, 103b below the respective bonding regions 106a, 106b can be an average distance over the extent of the contact structures 102. The topography of the contact structures 102 may also include locations equal, above, and below the average distance. The total height variation of the contact structures 102, given by the difference between the maximum and minimum height, may be substantially greater than the root-mean-square (RMS) variation. For example, a contact structure with a RMS of 1 nm may have a total height variation of 10 nm.

Accordingly, although contact features 103a, 103b may be slightly below the bonding regions 106a, 106b, a portion of contact features 103a, 103b may extend above the bonding regions 106a, 106b, resulting in a mechanical connection between the contact features 103a, 103b after bonding of the non-metal bonding region 106a to non-metal bonding region 106b. This mechanical connection may not result in an adequate electrical connection between contact features 103a, 103b due to an incomplete mechanical connection or native oxide or other contamination on contact features 103a, 103b. Subsequent temperature increase may improve the metal bonding, metal contact, metal interconnect, and/or conductance between contact features 103a, 103b as described above.

Alternatively, the temperature increase may result in mechanical contact and/or desired electrical interconnection between contact features 103a, 103b if the highest portion of contact features 103a, 103b is below bonding regions 106a, 106b and there is not a mechanical contact between contact features 103a, 103b after bonding.

Alternatively, contact features 103a may be below the surface of bonding region 106a and contact features 103b may be above bonding region 106b, or contact features 103a may be above the surface of bonding region 106a and contact features 103b may be below the surface of bonding region 106b. The difference between the distances of contact features 103a, 103b below bonding regions 106a, 106b (or vice versa) can be slightly positive. Alternatively, the difference between the distances of contact features 103a, 103b below bonding regions 106a, 106b can be nominally zero or slightly negative and a post-bond temperature increase may improve the metal bonding, metal contact, metal interconnect, conductance between contact features 103a, 103b as described above.

The height or depth of contact features 103a, 103b relative to the bonding regions 106a, 106b of elements 101a, 101b can be controlled with a polishing process that forms the surfaces of elements 101a, 101b, for example using chemical mechanical polishing (CMP). The CMP process typically may have a number of process variables including but not limited to the type of polishing slurry, rate of slurry addition, polishing pad, polishing pad rotation rate, and polish pressure. The CMP process can be further dependent on the specific non-metal and metal materials comprising the semiconductor elements 101a, 101b, relative polishing rates of non-metal and metal materials (similar polishing rates are preferred, for example nickel and silicon oxide), size, pitch and grain structure of the contact features 103a, 103b, and non-planarity of bonding regions 106a, 106b. Alternate polishing techniques, for example slurry-less polishing, may also be used.

The height or depth of contact features 103a, 103b relative to the bonding regions 106a, 106b may also be controlled with a slight dry etch of the material around contact features 103a, 103b on the surfaces of semiconductor elements 101a, 101b, for example using a plasma or reactive ion etch using a mixture of $CF_4$ and $O_2$, for the surfaces comprised of certain dielectric materials, for example silicon oxide, silicon nitride, or silicon oxynitride, preferably such that an increase in surface roughness, that would significantly decrease the bond energy between said surfaces, results. Alternatively, the height of contact features 103a, 103b may be controlled by the formation of a very thin metal layer on the contact features 103a, 103b. For example, electroless plating of some metals, for example gold, can be self-limiting to a very thin layer, for example approximately 5-50 nm. This method may have the additional advantage of terminating an oxidizing metal with very thin non-oxidizing metal, for example gold on nickel, to facilitate the formation of electrical connections.

Thus, in the bonding sequence, for embodiments such as those of FIGS. 1A-5C, contact between contact structures from opposing substrates can precede or be simultaneous with contact between bonding regions of opposing substrates. For embodiments such as those of FIGS. 6A to 8C, contact between contact structures from opposing substrates can occur after contact between bonding regions of opposing substrates.

Examples of Elongate Contact Features

In some arrangements, it may be challenging to align the contact pads of one semiconductor element with the corresponding contact pads of another semiconductor element. Some contact pads (such as the metallic pads 12, 15 of FIGS. 1A-1D) may have a relatively small or compact size and shape, which can make it difficult for traditional pick-and-place tools to align corresponding contact pads. For example, many pick-and-place tools have an alignment capability in a range of 2 microns to 10 microns, or in a range of 5 microns to 10 microns. Contact pads having major dimensions outside or near these ranges may be difficult to align using traditional pick-and-place tools, and may entail more expensive alignment equipment and/or procedures.

In some arrangements, the overall size of the contact pad may be increased so as to improve the alignment of corresponding pads from two bonded semiconductor elements. However, increasing the size of the contact pads may take up valuable real estate on the semiconductor elements. Moreover, increasing the size of the contact pads may also increase parasitic capacitance, thereby increasing power consumption and/or reducing the bandwidth of the semiconductor elements. In addition, larger contact pads may also increase the effect of dishing on polished surfaces of the respective semiconductor elements. The resulting large dishing effect may cause the non-conductive bonding and/or conductive regions to bond in a non-uniform manner. For direct bonding of metal (or conductively-doped semiconductor) and non-metal regions as described herein, the height of contacts above or depth of contacts below the substrate surface can be critical to achieving the desired contact bonds.

Accordingly, there remains a continuing need to provide improved alignment accuracy between corresponding contact pads while maintaining relatively small feature sizes during bonding. In various embodiments disclosed herein, a first semiconductor element can comprise a conductive first contact structure and a non-metallic first bonding region proximate the first contact structure. The first contact structure can include a conductive first elongate contact feature. A second semiconductor element can comprise a conductive second contact structure and a non-metallic second bonding region proximate the second contact structure. The second contact structure can include a conductive second contact feature. The first bonding region can be in contact with and directly bonded to the second bonding region. The first elongate contact feature can be oriented non-parallel with and can directly contact the second contact feature at an intersection between the first elongate contact feature and the second contact feature. The second contact feature can also be an elongate contact feature.

Because at least one of the contact features is elongated, greater misalignments can be tolerated when the two semiconductor elements are brought together. Furthermore, the use of an elongate contact feature can enable the use of relatively small feature sizes, such as relatively narrow lines relative to the larger contact regions. For example, even though the contact feature may be much longer along its length than its width in order to facilitate alignment, the relatively thin width of the elongate contact feature significantly reduces contact height or depth variations due to dishing during polishing. Furthermore, the narrow feature width facilitates a relatively small parasitic capacitance and a relatively low footprint on the element.

Figure 9A:
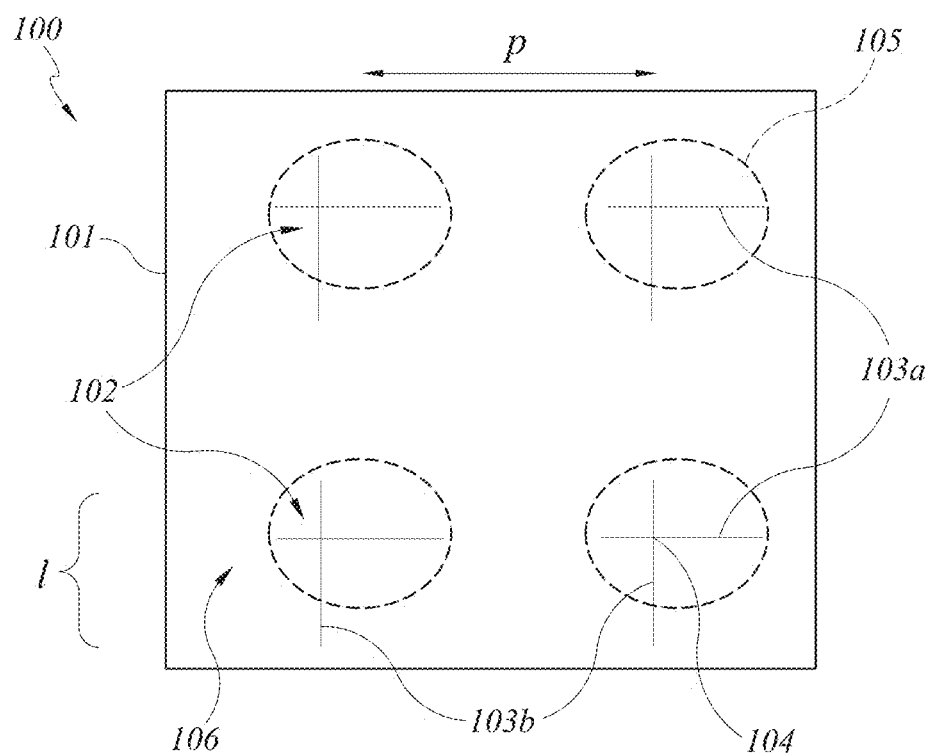
FIG. 9A is a schematic top plan view of the positions of conductive features in a bonded semiconductor structure, according to one embodiment.

FIG. 9A is a schematic top plan view of a bonded semiconductor structure 100, according to one embodiment. FIG. 9B is a schematic side sectional view of the bonded semiconductor structure of FIG. 9A. The bonded structure 100 of FIGS. 9A-9B can include a pair of bonded semiconductor elements 101. For ease of illustration, only one of the pair of bonded semiconductor elements 101 is shown in FIG. 9A. The semiconductor elements 101 can comprise a wafer, a partially-processed wafer, and/or a diced or partially-diced semiconductor device, such as an integrated circuit die or a microelectromechanical systems (MEMS) die. Each semiconductor element 101 can comprise a conductive contact structure 102 and a non-metallic bonding region 106 proximate the contact structure 102. As shown in FIGS. 9A-9B, for example, the bonding region 106 can surround or be disposed about the contact structure 102. The conductive contact structure 102 can comprise any suitable conductive material, including, e.g., a metal or a conductively-doped semiconductor material. For example, the contact structure 102 can comprise gold, copper, tungsten, nickel, silver, alloys thereof, or any other suitable material. The non-metallic bonding region 106 can comprise any suitable nonconductive material, including, e.g., a semiconductor material or an insulating material (such as a polymer). For example, the bonding regions 106 can comprise at least one of silicon, silicon oxide, silicon nitride, glass, silicon-on-insulator, silicon carbide, sapphire, germanium, gallium arsenide, gallium nitride, polymers, indium phosphide, or any other suitable non-metallic material.

The contact structure 102 includes contact features from each of the opposing or bonded pair of semiconductor elements 101. The contact structure 102 of a first semiconductor element 101 can include a first elongate contact feature 103a, and the contact structure 102 of a second semiconductor element (not shown in FIG. 9A) can comprise a second elongate contact feature 103b. In the embodiment of FIGS. 9A-9B, the first and second elongate contact features 103a, 103b can be generally linear elements having a length larger than a width. For example, the length of the contact features 103a, 103b can be at least twice the width, at least five times the width, or at least ten times the width. Length is used to refer to the longer dimension of each feature in the bonding plane (e.g., the interfacial plane along which the two elements 101 are directly bonded) while width refers to the narrower dimension in the bonding plane. Furthermore, it should be appreciated that elongate contact features may not be linear in other embodiments. Rather, the elongate contact features may be curved, e.g., such that the path length traversed by the contact feature in the bonding plane is longer than the width of the contact feature in the bonding plane.

The first elongate contact feature 103a of the first semiconductor element 101 can be disposed over and can be at least partially aligned with an underlying interconnect 105, such as a through-silicon via (TSV). Internal metallization (not shown) may connect the interconnect 105 with the contact structure 102 (e.g., first elongate contact structure 103a) of the first semiconductor element 101. For example, internal metallization or traces can be disposed laterally and/or vertically in the semiconductor element 101 to provide communication between the interconnect 105 and the contact structures 102. Moreover, in some embodiments, a conductive barrier (not shown) can be provided between the contact structure 102 and the interconnect 105 or intervening internal metallization. For example, in some embodiments, the conductive barrier can line a trench of a damascene structure. Additional metallization may also be provided at or near the surface of the semiconductor elements 101 to route signals laterally across the width of the element. As shown in FIG. 9A, the interconnects 105 can be spaced apart by an interconnect pitch p and can serve to electrically connect the contact structures 102 to external leads which communicate with the larger electronic system. The pitch p can be any suitable distance, e.g., in a range of 0.1 microns to 500 microns, in a range of 0.1 microns to 100 microns, in a range of 0.1 microns to 50 microns, in a range of 1 micron to 50 microns, or in a range of 10 microns to 50 microns.

To bond the two semiconductor elements, as explained above, the semiconductor elements 101 can be oriented relative to one another such that the first elongate contact feature 103a of one of the opposing elements 101 is non-parallel with the second elongate contact feature 103b of the other of the opposing elements 101. The two semiconductor elements 101 can be brought together such that at least the first and second non-metallic bonding regions 106 are in contact. As explained above, the surfaces of the bonding regions 106 can be prepared such that, when the bonding regions 106 of two semiconductor elements 101 are brought into contact, the non-metallic bonding regions 106 directly bond with one another to form a chemical bond without an intervening adhesive. Thus, the portion of the non-metallic bonding region 106 disposed on a first side of the first contact feature 103a can be directly bonded with corresponding portions of the non-metallic bonding region 106 disposed on both sides of the second contact feature 103b.

For example, in various embodiments, the bonding regions 106 can be polished and then very-slightly etched to create a smooth bonding surface. In various embodiments, the etched surfaces can be terminated with a nitrogen-containing species by, for example, exposing the etched surfaces to a plasma comprising nitrogen (such as nitrogen gas) or dipping the etched surfaces in a nitrogen-containing solution (such as an ammonia-containing solution). In other embodiments, other terminating species can facilitate the chemical, covalent bonding of the non-metallic bonding regions 106a, 106b. In various embodiments, the bonding regions 106 can be directly bonded together at room temperature. The bonding regions 106 can also be directly bonded together without applying external pressure to the semiconductor elements 101.

The first and second elongate contact features 103a, 103b can intersect one another at a contact intersection 104. As with the embodiments explained above with respect to FIGS. 1A-8C, the elongate contact features 103a, 103b can be directly bonded to one another to provide electrical communication between the features 103a, 103b. For example, in embodiments similar to those of FIGS. 1A-5C, where contacts protrude, bonding of non-metal (e.g., semiconductor or insulator) surfaces between contacts creates internal pressure that can bond the contact features 103a, 103b from opposing semiconductor elements, with or without the addition of heat. In embodiments similar to those of FIGS. 8A-8C, after the bonding regions 106 have been directly bonded to one another, the semiconductor elements 101 can be heated to cause the elongate contact features 103a, 103b to expand toward one another due to differential coefficient of thermal expansion (CTE) relative to surrounding materials, generating the internal pressure that causes the features 103a, 103b to be directly bonded to one another at the intersection 104. The semiconductor elements 101 can be heated in a range of 75° C. to 350° C., or more particularly, in a range of 100° C. to 250° C.

Advantageously, providing at least one elongate contact feature 103a and/or 103b can significantly increase the alignment tolerances for directly bonding conductive contact structures 102 together. Because at least one of the contact features 103a and/or 103b is elongated with a path length longer than its width in the bonding plane, the two semiconductor elements 101 can be misaligned by relatively large amounts while still facilitating direct bonding between the contact features 103a, 103b. For example, in bonded structures which utilize smaller or non-elongated contact features, the alignment tolerance of conventional pick-and-place machines may be in a range of 1 micron to 5 microns, or in a range of 1 micron to 10 microns.

By contrast, for an interconnect pitch p of 40 microns, the elongate contact features 103a, 103b can have a length l of about 20 microns, or about half the pitch of the interconnect pitch p. Because the length l of each contact feature 103a, 103b is large relative to the interconnect pitch p, it is easier for the pick-and-place machinery to achieve overlap or intersection between the two contact features 103a, 103b, which results in a larger tolerance for misalignments. For example, in the example of a 40 micron interconnect pitch, the misalignment tolerance (i.e., the degree to which the semiconductor elements 101 may be misaligned relative to one another laterally) can be in a range of 5 microns to 10 microns.

It should be appreciated that, in other embodiments, other suitable lengths l may be used. For example, the length l of the elongate contact features 103a, 103b shown in FIGS. 9A-9B may be in a range of 0.05 microns to 500 microns, in a range of 0.05 microns to 100 microns, in a range of 0.05 microns to 50 microns, in a range of 0.1 microns to 50 microns, in a range of 1 micron to 50 microns, in a range of 5 microns to 50 microns, in a range of 10 microns to 50 microns, in a range of 10 microns to 40 microns, or in a range of 15 microns to 30 microns. The width of the contact features 103a, 103b can be sufficiently small so as to reduce parasitic capacitance and to maintain a small footprint on the semiconductor elements 101. For example, the width of the contact features 103a can be in a range of 0.01 microns to 10 microns, in a range of 0.01 microns to 5 microns, in a range of 0.1 microns to 10 microns, in a range of 0.1 microns to 5 microns, in a range of 0.5 microns to 5 microns, 0.5 microns to 4 microns, in a range of 1 micron to 5 microns, in a range of 1 micron to 3.5 microns, or in a range of 1.5 microns to 3 microns.

Although both contact features 103a, 103b shown in FIGS. 9A-9B are illustrated and described as linear contact features, it should be appreciated that in other embodiments, the elongate contact features can instead comprise curved shapes. For example, it should be appreciated that the first semiconductor element can comprise a curved contact feature, and the second semiconductor element can comprise any one of a linear contact feature, a two-dimensionally patterned contact feature (e.g., a grid contact feature), a curved contact feature, etc. Thus, misalignment can be reduced while still minimizing dishing (and consequent uniformity problems for the height/depth of contacts) so long as the path length (e.g., whether a linear path length or a curved path length) is sufficiently longer than the width of the contact feature. Additional elongate contact features are illustrated below in connection with FIGS. 12A-12H.

The contact features 103a, 103b can comprise protruded contacts extending above the bonding regions 106. For example, the contact features 103a, 103b can comprise protruded contacts similar to the metallic pads 12, 15 shown in the embodiment of FIGS. 1A-1D. In other embodiments, the contact features 103a, 103b can comprise recessed contacts in which the contact features 103a, 103b are initially disposed below the bonding regions 106 and are brought into contact after the bonding regions 106 are directly bonded together (e.g., similar to that shown in FIGS. 6A-6C and 8A-8C). In still other embodiments, one of the contact feature 103a or 103b can comprise a protruded contact, and the other of contact feature 103a, 103b can comprise a recessed contact (e.g., similar to that shown in FIGS. 7A-7C).

Figure 10:
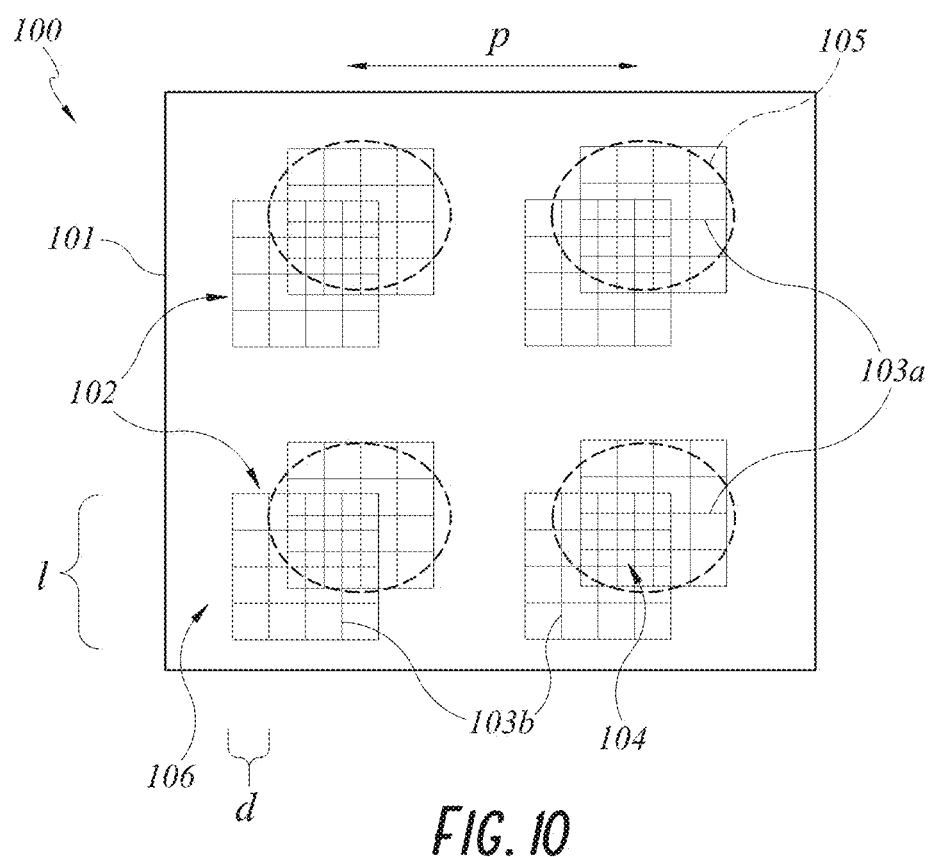
FIG. 10 is a schematic top plan view of the positions of conductive features in a bonded semiconductor structure, according to another embodiment.

FIG. 10 is a schematic top plan view of a bonded semiconductor structure 100, according to another embodiment. Unless otherwise noted, reference numerals shown in FIG. 10 represent components generally similar to those referenced in FIGS. 9A-9B. For example, each of two bonded semiconductor elements 101 can include corresponding conductive contact structures 102 and non-metallic bonding regions 106 disposed proximate the contact structures 102. The conductive contact structures 102 can comprise elongate contact features 103a, 103b. Unlike the embodiment of FIGS. 9A-9B, however, in the embodiment of FIG. 10, the contact features 103a, 103b can comprise a two-dimensionally patterned contact feature, e.g., plurality of intersecting conductive segments that define a two-dimensional pattern of elongate contact features for improving alignment in bonded structures. The intersecting conductive segments can be curved, linear, polygonal, circular, elliptical, etc. For example, in FIG. 10, corresponding orthogonal grid patterns can be disposed on the semiconductor elements 101. By contrast, FIGS. 12A-12H illustrate additional embodiments in which patterns of elongate contact features 103a, 103b may define other two-dimensional shapes that may assist in improving rotational alignment of bonded structures.

The grid patterns of the contact features 103a, 103b of FIG. 10 can comprise multiple intersecting lines. Although the intersecting lines of the grid patterns of FIG. 10 are shown as being perpendicular to one another, in other embodiments, the intersection lines of the grid patterns can instead be disposed at non-perpendicular angles. Furthermore, although each of the multiple lines of the grid patterns are linear in FIG. 10, in other embodiments, the lines of the grid pattern can instead be curved. See, for example, the patterns of FIGS. 12A-12H.

The length l of the grid pattern can have the same lengths l as the lines of the embodiment of FIGS. 9A-9B. For example, the length l of the grid pattern can be in a range of 0.05 microns to 500 microns, in a range of 0.05 microns to 100 microns, in a range of 0.05 microns to 50 microns, in a range of 0.1 microns to 50 microns, in a range of 1 micron to 50 microns, in a range of 5 microns to 50 microns, in a range of 10 microns to 50 microns, in a range of 10 microns to 40 microns, or in a range of 15 microns to 30 microns. The width of each of the lines of the grid pattern of the contact features 103a, 103b can be sufficiently small so as to avoid dishing issues that may interfere with reliable metal bonding across semiconductor elements 101. For example, the width of the multiple lines of the grid pattern of the contact features 103a can be in a range of 0.01 microns to 10 microns, in a range of 0.01 microns to 5 microns, in a range of 0.1 microns to 10 microns, in a range of 0.1 microns to 5 microns, in a range of 0.5 microns to 5 microns, 0.5 microns to 4 microns, in a range of 1 micron to 5 microns, in a range of 1 micron to 3.5 microns, or in a range of 1.5 microns to 3 microns. The separation distance d between adjacent lines of the grid pattern can be any suitable distance, e.g., in a range of 0.01 microns to 100 microns, 0.01 microns to 50 microns, in a range of 0.1 microns to 50 microns, in a range of 0.5 microns to 50 microns, in a range of 0.5 microns to 10 microns, in a range of 0.5 microns to 5 microns, or in a range of 1 micron to 5 microns.

Advantageously, the use of grid patterns as the contact features 103a, 103b can enable for an intersecting region 104 that has multiple electrical, direct bonded contacts. Because the grid pattern comprises multiple intersecting lines, the embodiment of FIG. 10 may enable the creation of electrical contacts while accommodating large amounts of misalignment. Furthermore, as compared with the embodiment of FIGS. 9A-9B, the creation of multiple electrical connections within a grid pattern can allow a lower current density, at least because there is a greater contact area. For example, in the embodiment of FIG. 10, the total surface area of the contact (i.e., the area in which the contact features 103a, 103b are directly bonded) can be in a range of 10 $\mu m^2$ to 30 $\mu m^2$, or in a range of 5 $\mu m^2$ to 35 $\mu m^2$, or, more particularly, in a range of 10 $\mu m^2$ to 25 $\mu m^2$. The current for each contact is spread over a greater number of connections with higher overall contact surface, thus reducing the current density for a given current.

The grid pattern shown in FIG. 10 comprises an m×n array of cells, in which m=n=4. It should be appreciated, however, that the grid pattern can comprise any number of cells, and m, n can be even or odd. For example, in an alternative grid pattern, the m×n array of cells can comprise an odd number of cells, e.g., m=n=1, 3, 5, etc. In such embodiments, the use of an odd number of cells may enable a constant crossover area at a given misalignment for a minimum contact structure area (for example, when the extent of each cell is comparable to the alignment accuracy). The lines of the grid pattern can be narrower than the spacing between the grid lines to help reduce dishing and increase bond energy of the non-metallic portions. The size or extent of the cell that can be repeated to comprise the grid can be comparable to the 3 sigma alignment accuracy of the alignment tool(s) used to align and place bonding surfaces together such that at least two connection points have an area given by the product of line widths on the opposed bonding surfaces when m=1. The number of connection points can then increase when m=1. The interconnection area can be increased by increasing the number of connection points or increasing the width of the line in the grid.

In conventional bonding arrangements, a separate metallic layer (e.g., an aluminum pad) may be created near the top surface of the semiconductor element so as to enable electrical communication between two bonded semiconductor elements 101a, 101b. Moreover, the metallic contact pad may be relatively large so as to accommodate the corresponding contacts or bumps on the opposing semiconductor element, which can increase parasitic capacitance. In such conventional arrangements, vertical connections, such as vias or TSVs extend from the contact pads into the semiconductor element(s) to connect with corresponding traces for signal routing. In such arrangements, therefore, the contact pads are relatively large, and multiple trace layers may be used to ensure that the signals are routed properly. The vertical connections occupy layers that could otherwise be employed for lateral routing.

Figure 11A:
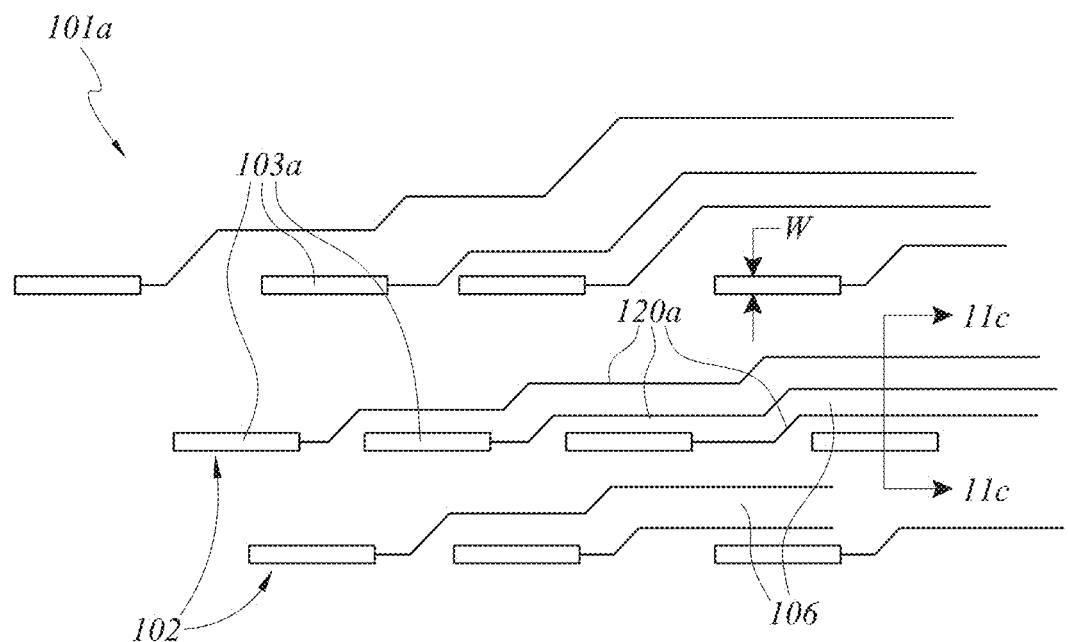
FIG. 11A is a schematic plan view of a first semiconductor element having a plurality of elongate contact features connected with corresponding underlying traces.
Figure 11B:
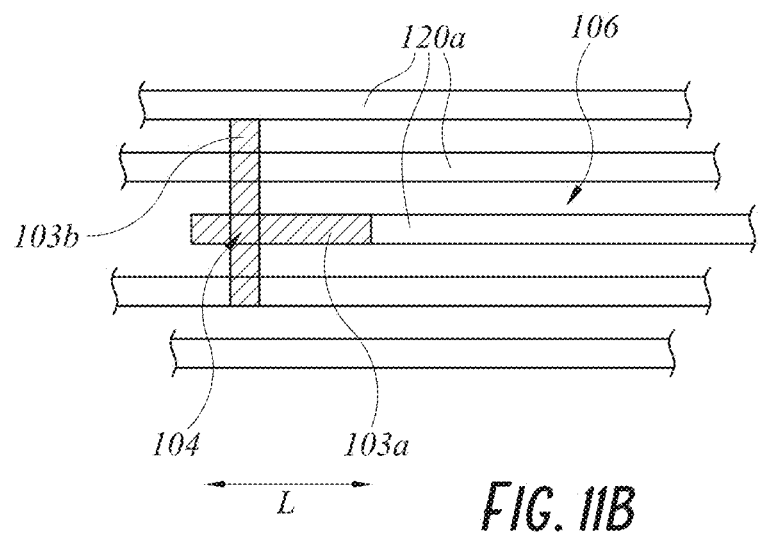
FIG. 11B is a schematic plan view of an exemplary contact feature and associated underlying traces of the first semiconductor element, and a contact feature of a second semiconductor element aligned to make contact in a crossing orientation with a contact feature of the first semiconductor element.
Figure 11C:
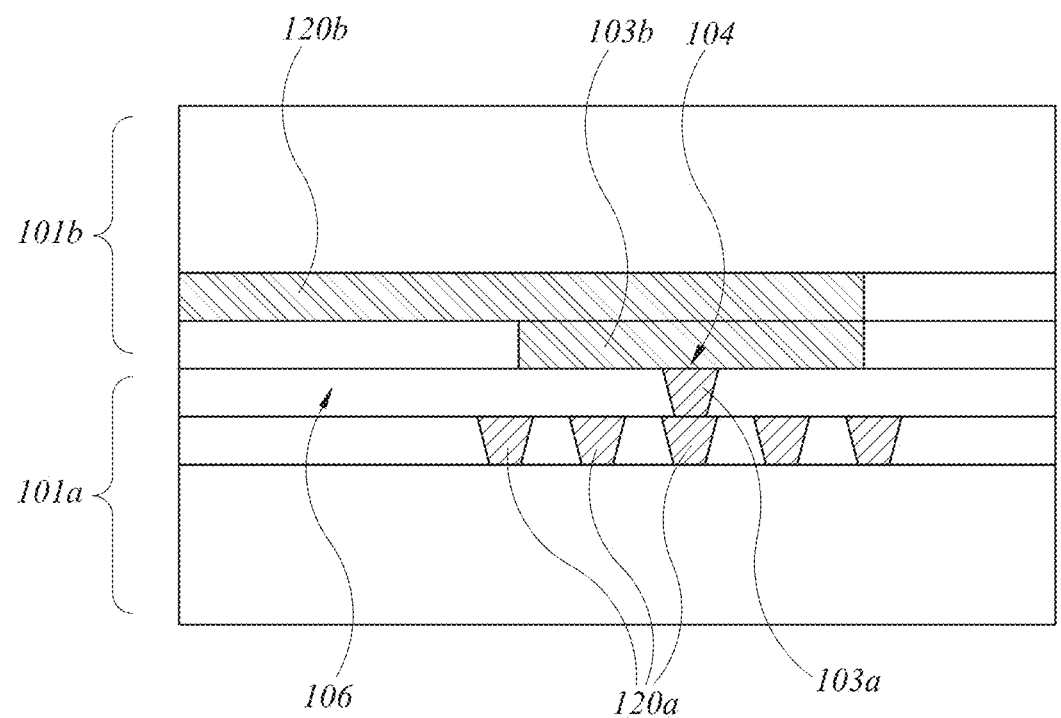
FIG. 11C is a schematic side cross-sectional view of two bonded semiconductor elements including a direct connection between crossing contact features of both elements.

FIGS. 11A-11C illustrate the use of elongate contact features 103a, 103b to provide electrical communication with corresponding underlying traces 120 for the reliable routing of electrical signals through the semiconductor elements 101a, 101b. In particular, FIG. 11A is a schematic top plan view of a first semiconductor element 101a having a plurality of elongate contact features 103a connected with corresponding underlying traces 120a. FIG. 11B is a schematic top plan view of an exemplary contact feature 103a and associated underlying traces 120a of the first semiconductor element 101a, and also shows a contact feature of a second semiconductor element aligned to make contact in a crossing orientation with a contact feature of the first semiconductor element. FIG. 11C is a schematic side cross-sectional view of two bonded semiconductor elements 101a, 101b including a direct connection between crossing contact features 103a, 103b of each element 101a, 101b.

As shown in FIG. 11A, the first semiconductor element 101a can include a plurality of contact structures 102 comprising elongate contact features 103a exposed at a top surface of the first semiconductor element 101a. As with the embodiments of FIGS. 8A-10, a non-metallic bonding region 106 can be disposed proximate or surrounding the contact features 103a, and the non-metallic bonding region 106 can cover the traces 120a. Each contact feature 103a is electrically connected with and preferably extends from a corresponding trace 120a which is disposed below the contact feature 103a. Thus, the traces 120a shown in FIG. 11A are embedded within the semiconductor element 101a below the contact features 103a. The traces 120a can be jogged or offset relative to one another so as to enable the reliable routing of traces 120a for each contact feature 103a without crosstalk. While FIG. 11A shows the contact features 103a as wider than the underlying traces 120a for purposes of illustration, it will be understood from FIGS. 11B and 11C below that in fact the contact features can have the same width as the underlying traces 120a. For example, in some arrangements, the width of the trace 120a and the width of the contact feature 103a can be in a range of 0.5 micron to 5 microns, in a range of 1 micron to 3 microns, e.g., about 2 microns.

As shown in FIGS. 11B-11C, the exemplary contact feature 103a can be disposed on top of the corresponding trace 120a to which the exemplary contact feature 103a is connected. The elongate contact feature 103a can extend along only a portion of the trace 120a and can have a length l and a width w selected so as to ensure that the contact feature 103a of the first semiconductor element 101a intersects and contacts a corresponding contact feature 103b of the second semiconductor element 101b. The contact feature 103b of the second semiconductor element 101b is shown in FIG. 11B for purposes of illustrating their relative orientations when aligned for contact.

The length l of the elongate contact features 103a, 103b shown in FIGS. 11a-11c may be in a range of 0.05 microns to 500 microns, in a range of 0.05 microns to 100 microns, in a range of 0.05 microns to 50 microns, in a range of 0.1 microns to 50 microns, in a range of 1 micron to 50 microns, in a range of 5 microns to 50 microns, in a range of 10 microns to 50 microns, in a range of 10 microns to 40 microns, or in a range of 15 microns to 30 microns. The width w of the contact features 103a, 103b can be sufficiently small so as to avoid dishing problems, reduce parasitic capacitance and to maintain a small footprint on the semiconductor elements 101. For example, the width of the contact features 103a can be in a range of 0.01 microns to 10 microns, in a range of 0.01 microns to 5 microns, in a range of 0.1 microns to 10 microns, in a range of 0.1 microns to 5 microns, in a range of 0.5 microns to 5 microns, 0.5 microns to 4 microns, in a range of 1 micron to 5 microns, in a range of 1 micron to 3.5 microns, or in a range of 1.5 microns to 3 microns. The width 2 of the contact features may be the same, or within ±10%, more particularly within ±5%, of the widths of the traces 102a from which they extend.

As shown in FIG. 11C, the contact feature 103a from the first semiconductor element 101a can contact and be bonded to the corresponding contact feature 103b from the second semiconductor element 101b at an intersection region 104. The exemplary contact feature 103a shown in FIG. 11C can be disposed over and in electrical contact with only the trace 120a associated with that contact feature 103a. Within the same metallization level, traces 120a associated with other contact features (not shown) can extend generally parallel with and not intersect the trace 120a associated with the illustrated contact feature 103a. Similarly, the exemplary contact feature 103b of the second semiconductor element 101b can extend over and be in electrical contact with only the trace 120b associated with that contact feature 103b. As shown in FIG. 11C, the contact feature 103b and its trace 120b can extend non-parallel (e.g., generally perpendicular) relative to the contact feature 103a and its trace 120a. Although the trace 120b is illustrated in FIG. 11C as extending laterally (e.g., non-parallel with the traces 120a), in other arrangements, the contact feature 103b of the second element 101b can be connected with other types of internal routing features, including vertical and/or horizontal routing features, or routing features that extend in any other direction. Furthermore, in some arrangements, the routing features for the first semiconductor element 101a may be different from the routing features of the second semiconductor element 101b. For example, the traces 120a may only be formed in the first element 101a, and other types of routing features may be formed in the second element 101b.

Advantageously, the embodiment illustrated in FIGS. 11A-11C can enable the use of smaller contact features which can reduce parasitic capacitance while improvement the alignment accuracy of the bonded structures. Moreover, the positioning of the contact features 103a, 103b relative to the corresponding traces 120a, 120b can enable efficient routing of electrical signals without providing multiple routing and/or contact layers. As the illustrated contact features 103a extend directly from underlying lateral traces, the metallization level is fully employed for lateral routing without the need for intervening interlevel dielectrics (ILDs) solely for vertical connections (such as vias). As with the embodiments of FIGS. 9A-10, the semiconductor elements 101a, 101b can comprise any suitable type of semiconductor element. For example, in one embodiment, the first semiconductor element 101a may comprise an interposer and the second semiconductor element 101b may comprise an integrated device die. In other embodiments, both semiconductor elements 101a, 101b may comprise integrated device dies.

FIGS. 12A-12H are schematic top plan views of conductive contact structure 102, according to various other embodiments. Unless otherwise noted, reference numerals shown in FIGS. 12A-12H represent components generally similar to those referenced in FIGS. 8A-11C. For example, a semiconductor element (not shown) can include corresponding conductive contact structures 102 and non-metallic bonding regions 106 disposed proximate the contact structures 102. The conductive contact structures 102 can comprise elongate contact features 103a, 103b. In FIGS. 12A-12H, only one contact feature 103a, associated with a corresponding semiconductor element, is shown. As with the embodiment of FIG. 10, the contact features 103a, 103b can comprise a two-dimensionally patterned contact feature, e.g., a plurality of intersecting conductive segments that define a two-dimensional pattern of elongate contact features for improving alignment in bonded structures. For example, the contact features 103a of FIGS. 12A-12H can comprise bounded structures of elongate segments disposed about a central region. The contact features 103a shown in FIGS. 12A-12H define patterns of elongate contact features that may assist in improving rotational alignment of bonded structures. For example, in FIGS. 12A-12H, the contact structures 102 may comprise rotationally symmetric, or near symmetric, elongate contact features 103a. Thus, the elongate contact features 103a of FIGS. 12A-12H can accommodate for linear misalignment, since the contact structure 102 includes a plurality of elongate conductive segments. The elongate contact features 103a can also accommodate for rotational misalignments, because outwardly-extending segments 122 of two rotationally-misaligned contact structures 102 may provide sufficient electrical connection between two bonded semiconductor elements.

Figure 12B:
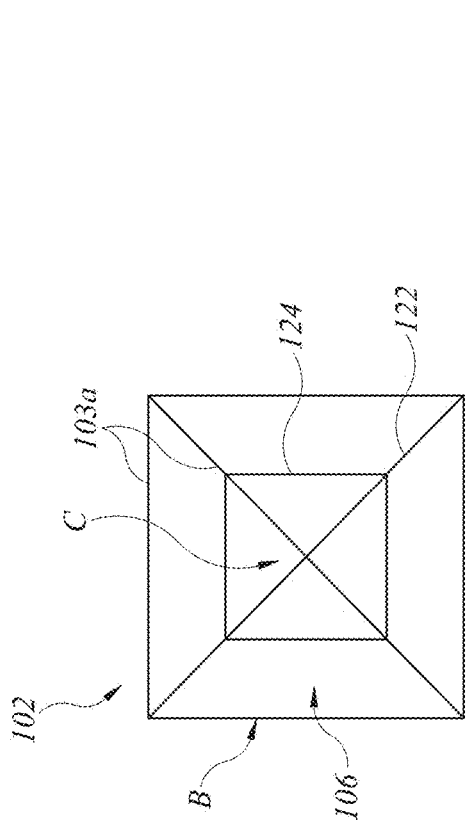
FIG. 12B is a schematic top plan view of a polygonal conductive contact structure having a quadrilateral profile, according to another embodiment.
Figure 12A:
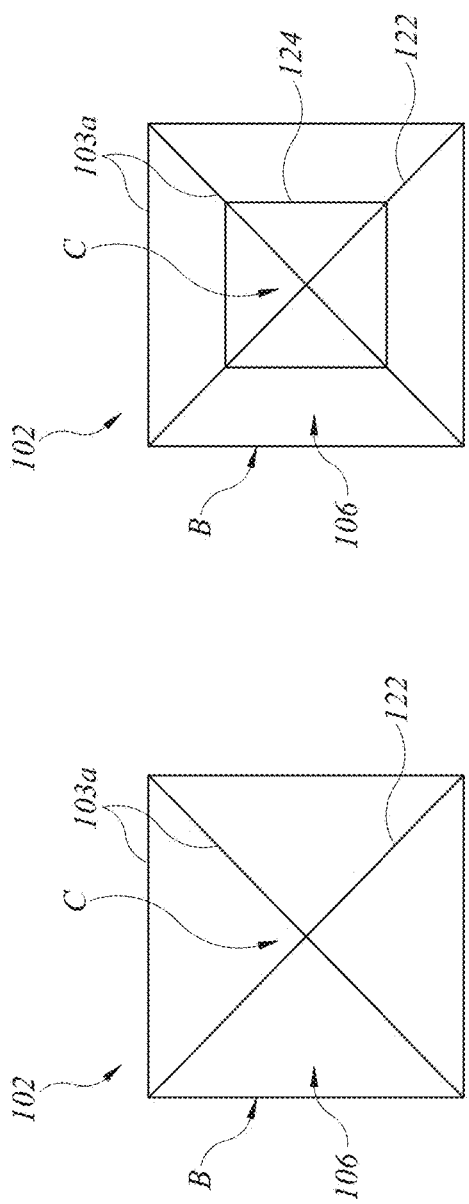
FIG. 12A is a schematic top plan view of a conductive contact structure having a quadrilateral profile, according to various other embodiments.

The pattern of the contact structure 102 may comprise any suitable shape. For example, as shown in FIG. 12A, the contact structure 102 can comprise a polygonal boundary B (e.g., a quadrilateral, rectangular or square boundary) disposed about a central region C, which may or may not be at the geometric center of the contact structure 102. The outwardly-extending segments 122 can extend radially outward from the central region C, so as to reduce rotational and lateral misalignments. As with FIG. 12A, the contact structure 102 of FIG. 12B can comprise a polygonal boundary B disposed about the central region C. In addition, a plurality of lateral connectors 124 can interconnect the outwardly-extending segments 122, which may further reduce misalignments.

Figure 12D:
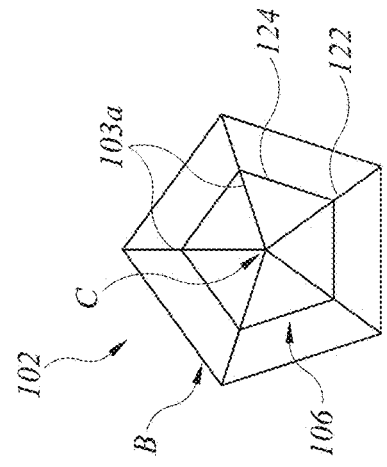
FIG. 12D is a schematic top plan view of a conductive contact structure having a pentagonal profile, according to another embodiment.
Figure 12C:
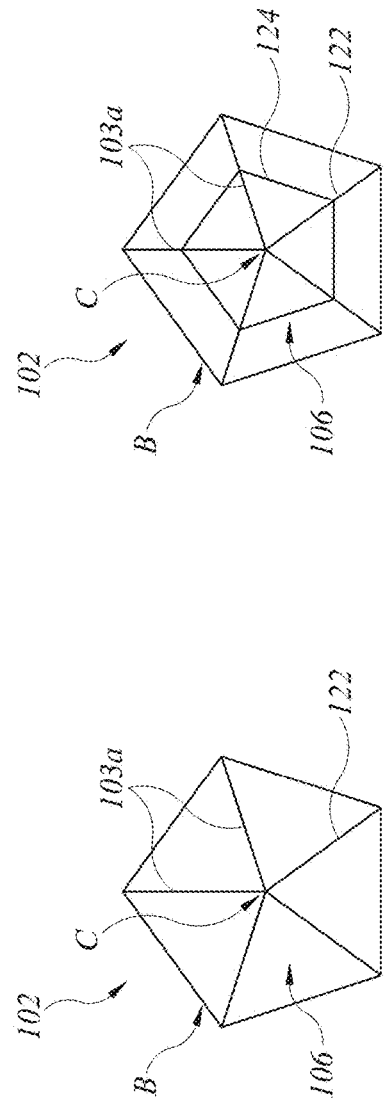
FIG. 12C is a schematic top plan view of a conductive contact structure having a pentagonal profile, according to various embodiments.

FIGS. 12C-12D illustrate contact structures 102 having a polygonal boundary B, which comprises a pentagonal boundary. In FIG. 12D, the lateral connectors 124 can interconnect the outwardly-extending segments 120. FIGS. 12E-12F illustrate contact structures 102 having a polygonal boundary B, which comprises a hexagonal boundary. In FIG. 12F, the lateral connectors 124 can interconnect the outwardly-extending segments 120. Although FIGS. 12A-12F depict polygonal boundaries of quadrilateral, pentagonal, and hexagonal profiles, it should be appreciated that any suitable polygonal boundary may be used. Moreover, as shown in FIGS. 12G-12H, the contact structures 102 may also comprise curved contact features 103*a*, e.g., circular or elliptical boundaries B. FIG. 12H illustrates lateral connectors 124 connecting the outwardly-extending segments 120.

Thus, the elongate contact features 103*a*, 103*b* disclosed herein can define any suitable pattern. Beneficially, the contact features 103*a*, 103*b* can improve lateral and/or rotational misalignments, while providing electrical interconnection between directly bonded semiconductor elements.

Numerous modifications and variations of the present invention are possible in light of the above teachings. It is therefore to be understood that within the scope of the appended claims, the invention may be practiced otherwise than as specifically described herein.

What is claimed is:

1. A bonded structure comprising:
a first semiconductor element comprising a conductive first contact structure and a non-metallic first bonding region proximate the first contact structure, the first contact structure comprising a conductive first grid pattern of multiple intersecting lines; and
a second semiconductor element comprising a conductive second contact structure and a non-metallic second bonding region proximate the second contact structure, the second contact structure comprising a conductive second grid pattern of multiple intersecting lines,
wherein the first bonding region is in contact with and directly bonded to the second bonding region, and
wherein the first grid pattern intersects and directly contacts the second grid pattern.

2. The bonded structure of claim 1, wherein the first grid pattern is directly bonded to the second grid pattern at one or more intersections between the first grid pattern and the second grid pattern.

3. The bonded structure of claim 1, wherein at least one of the first and second conductive contact structures comprises at least one of a metal and a conductively-doped semiconductor material.

4. The bonded structure of claim 1, wherein at least one of the first and second bonding regions comprises at least one of a semiconductor material and an insulating material.

5. The bonded structure of claim 4, wherein at least one of the first and second bonding regions comprises silicon oxide.

6. The bonded structure of claim 1, wherein the first bonding region is directly bonded to the second bonding region along an interface, the interface between the first bonding region and the second bonding region extending substantially to the first and second conductive contact structures.

7. The bonded structure of claim 1, wherein a pitch of lines of the first grid pattern is in a range of 1 micron to 10 microns.

8. A bonded structure comprising:
a first semiconductor element comprising a conductive first contact structure and a non-metallic first bonding region surrounding the first contact structure, the first contact structure comprising a conductive first elongate contact feature, the first elongate contact feature comprising a semiconductor material heavily doped with an electrical dopant, the first bonding region comprising a lightly doped or an undoped semiconductor material; and
a second semiconductor element comprising a conductive second contact structure and a non-metallic second bonding region surrounding the second contact structure, the second contact structure comprising a conductive second contact feature,
wherein the first bonding region is in contact with and directly bonded to the second bonding region, and
wherein the first elongate contact feature directly contacts and is directly bonded to the second contact feature.

9. The bonded structure of claim 8, wherein the first elongate contact feature is oriented non-parallel with the second contact feature, the second contact feature comprising an elongate contact feature.

10. The bonded structure of claim 8, wherein the non-metallic second bonding region comprises a lightly doped or an undoped semiconductor material.

11. The bonded structure of claim 8, wherein the conductive second contact feature comprises a semiconductor material heavily doped with an electrical dopant.

12. The bonded structure of claim 8, wherein the first contact structure comprises a plurality of lines in a grid pattern.

13. The bonded structure of claim 12, wherein the second contact structure comprises a plurality of lines in a grid pattern.

14. The bonded structure of claim 8, wherein the first contact structure defines a boundary disposed about a central region and a plurality of conductive segments extending outwardly from the central region.

15. The bonded structure of claim 14, further comprising a plurality of lateral connectors that connect the plurality of conductive segments.

16. The bonded structure of claim 8, wherein the first elongate contact feature has a length and a width, the length being at least twice the width.

17. The bonded structure of claim 8, wherein a length of the first elongate contact feature is in a range of 5 microns to 50 microns.

18. The bonded structure of claim 17, further comprising a through-silicon via (TSV) disposed within the first semiconductor element below an intersection of the first elongate contact feature and the second contact feature.

19. The bonded structure of claim 18, further comprising one or more conductive traces disposed between and electrically connecting the TSV with the first elongate contact feature.

20. The bonded structure of claim 8, wherein at least one of the first elongate contact feature and the second contact feature is curved.

* * * * *